(12) United States Patent
Kaifuchi

(10) Patent No.: US 10,748,836 B2
(45) Date of Patent: Aug. 18, 2020

(54) SEMICONDUCTOR LASER MODULE AND METHOD FOR MANUFACTURING THE SAME

(71) Applicant: FUJIKURA LTD., Tokyo (JP)

(72) Inventor: Yoshikazu Kaifuchi, Sakura (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 16/078,192

(22) PCT Filed: Feb. 20, 2017

(86) PCT No.: PCT/JP2017/006140
§ 371 (c)(1),
(2) Date: Aug. 21, 2018

(87) PCT Pub. No.: WO2017/145987
PCT Pub. Date: Aug. 31, 2017

(65) Prior Publication Data
US 2019/0067161 A1    Feb. 28, 2019

(30) Foreign Application Priority Data
Feb. 25, 2016   (JP) .................. 2016-033875

(51) Int. Cl.
*H01S 5/022* (2006.01)
*H01L 23/40* (2006.01)
(Continued)

(52) U.S. Cl.
CPC ............ *H01L 23/40* (2013.01); *B23K 1/0008* (2013.01); *H01L 23/36* (2013.01); *H01S 5/022* (2013.01);
(Continued)

(58) Field of Classification Search
CPC ....... H01L 23/40; H01L 23/36; B23K 1/0008; H01S 5/022; H01S 5/024; H01S 5/02461;
(Continued)

(56) References Cited

U.S. PATENT DOCUMENTS 4,360,965 A * 11/1982 Fujiwara ............. H01L 23/3732
228/123.1
5,016,083 A *  5/1991 Ishii .................... H01L 23/3738
257/713
(Continued)

FOREIGN PATENT DOCUMENTS

JP        59-72752 U    5/1984
JP        7-176820 A    7/1995
(Continued)

OTHER PUBLICATIONS

Drawing description translation JP5972752, p. 1. (Year: 1984).*
(Continued)

*Primary Examiner* — Tod T Van Roy
*Assistant Examiner* — Delma R Fordé
(74) *Attorney, Agent, or Firm* — Westerman, Hattori, Daniels & Adrian, LLP

(57) ABSTRACT

The semiconductor laser module 1 has an electrically conductive heat sink 10, a submount 20 disposed above the heat sink 10, a semiconductor laser device 30 disposed above the submount 20, a lower solder layer 50 disposed between the heat sink 10 and the submount 20, and an upper solder layer 60 electrically connected to the semiconductor laser device 30 and the heat sink 10. This upper solder layer 60 has an electric resistivity lower than an electric resistivity of the submount 20 and extends along surfaces 21 and 22 of the submount 20 to the heat sink 10.

10 Claims, 17 Drawing Sheets

(51) Int. Cl.
*H01S 5/024* (2006.01)
*H01S 5/026* (2006.01)
*H01S 5/042* (2006.01)
*B23K 1/00* (2006.01)
*H01L 23/36* (2006.01)

(52) U.S. Cl.
CPC ............ *H01S 5/024* (2013.01); *H01S 5/0261* (2013.01); *H01S 5/02236* (2013.01); *H01S 5/02272* (2013.01); *H01S 5/02276* (2013.01); *H01S 5/02469* (2013.01); *H01S 5/02476* (2013.01); *H01S 5/02484* (2013.01); *H01S 5/0425* (2013.01)

(58) Field of Classification Search
CPC ............ H01S 5/02476; H01S 5/02236; H01S 5/02272; H01S 5/02276; H01S 5/0216; H01S 5/02484; H01S 5/02492; H01S 5/02469

See application file for complete search history.

(56) References Cited

U.S. PATENT DOCUMENTS

| | | | | |
|---|---|---|---|---|
| 7,528,413 | B2* | 5/2009 | Yoshida | C04B 35/52 257/77 |
| 7,768,120 | B2* | 8/2010 | Takashima | H01S 5/02492 257/706 |
| 9,935,422 | B2* | 4/2018 | Komissarov | H01S 5/02272 |
| 2004/0135247 | A1 | 7/2004 | Takashima et al. | |
| 2007/0215337 | A1 | 9/2007 | Morigami et al. | |
| 2008/0157347 | A1* | 7/2008 | Takashima | H01S 5/02492 257/712 |
| 2011/0051758 | A1* | 3/2011 | Krejci | H01S 5/02272 372/34 |
| 2012/0257647 | A1 | 10/2012 | Shu et al. | |
| 2014/0211819 | A1 | 7/2014 | Yoshida et al. | |
| 2015/0263487 | A1* | 9/2015 | Yamamoto | H01S 5/20 372/44.01 |

FOREIGN PATENT DOCUMENTS

| | | | | |
|---|---|---|---|---|
| JP | 2839015 B2 * | 12/1998 | | H01L 24/743 |
| JP | 11-307875 A | 11/1999 | | |
| JP | 2003-152145 A | 5/2003 | | |
| JP | 2005-26333 A | 1/2005 | | |
| JP | 2013-004571 A | 1/2013 | | |
| WO | 2006/061937 A1 | 6/2006 | | |
| WO | 2013/150715 A1 | 10/2013 | | |

OTHER PUBLICATIONS

Claim translation of JP5972752, p. 1. (Year: 1984).*
Bibliographic data of JP5972752, p. 1. (Year: 1984).*
International Search Report dated May 16, 2017, issued in counterpart International Application No. PCT/JP2017/006140 (2 pages).
Notice of Reasons for Refusal dated May 14, 2019, issued in counterpart JP Application No. 2016-033875, with English translation (10 pages).
Supplementary European Search Report dated Nov. 28, 2019, issued in counterpart application No. 17756425.9. (24 pages.

* cited by examiner

SEMICONDUCTOR LASER MODULE AND METHOD FOR MANUFACTURING THE SAME

TECHNICAL FIELD

The present invention relates to a semiconductor laser module and a method of manufacturing the same, and more particularly to a semiconductor laser module having a submount and a method of manufacturing the same.

BACKGROUND ART

In recent years, there has been developed a fiber laser using a semiconductor laser as a pump light source and a rear-earth-doped fiber as an amplifying medium. For example, a high-power semiconductor laser diode (LD) formed of a material based on gallium arsenide (GaAs) has been used as a pump light source of such a fiber laser. The power of fiber lasers has been increased in recent years. Accordingly, it has also been strongly demanded to increase the power of laser diodes. For example, the output of over 10 W has been required for one laser diode chip, or the output of almost 20 W has been required in some cases.

As the power of laser diodes is increased, the amount of heat generated from laser diodes also increases. The characteristics of the laser diode is also problematically deteriorated by heat generated in a laser diode itself. For example, assuming that the photoelectric conversion efficiency of a laser diode that has an output of 15 W is 60%, the laser diode generates the amount of heat as large as 10 W.

Generally, a laser diode is mounted on a plate, which is referred to as a submount, and used in the form of a module in which the laser diode is integrated with the submount. Therefore, a submount that has a high heat conductivity and exhibits high heat dissipation performance is required to avoid deterioration of the characteristics of a laser diode due to heat generated by the aforementioned increase of the power of the laser diode.

Furthermore, if a thermal expansion coefficient of a laser diode is greatly different from a thermal expansion coefficient of a submount, a stress may be generated by the thermal hysteresis upon mounting the laser diode on the submount, resulting in deteriorated characteristics of the laser diode. Accordingly, a submount is required to be formed of a material having a thermal expansion coefficient that is close to a thermal expansion coefficient of a laser diode.

Generally, a laser diode has a bottom surface having an electrode formed thereon, which is connected to a submount. Thus, an electric current is supplied to the laser diode through the submount. Therefore, in order to obtain a high power with high efficiency, reduction of an electric resistance of the submount is required in addition to enhancement of the heat dissipation performance of the submount.

Thus, because of an increased power of a laser diode, a submount on which the laser diode is mounted requires 1) enhanced heat dissipation performance, 2) a thermal expansion coefficient that is close to that of the laser diode, and 3) a reduced electric resistance.

However, it is difficult to find out a material that simultaneously meets the aforementioned three requirements. For example, when a material that generally exhibits high heat dissipation performance, such as ceramics, is used as a material for a submount, high heat dissipation performance can be achieved. Nevertheless, since ceramics is an electrical insulator, the electric resistance of the submount becomes very high.

Patent Literature 1 discloses that silicon is used as a material for a submount (see, e.g., paragraph [0024]). Thus, the electric resistance of the submount can be reduced by use of silicon. However, silicon has a heat conductivity of 150 W/mK, which is not so high. Accordingly, use of silicon cannot achieve high heat dissipation performance.

Furthermore, Patent Literature 2 discloses an embodiment using CuW as a material for a submount disposed right below a laser chip (see paragraphs [0028] and [0029] and FIG. 7). CuW has an electric resistivity as low as $10^{-8}$ $\Omega$m and a heat conductivity of 170 W/mK, which is higher than that of silicon. Additionally, CuW has a thermal expansion coefficient of about 6.5 ppm/K, which is close to a thermal expansion coefficient of gallium arsenide (about 5.9 ppm/K), which may also be used as a material for a semiconductor laser diode. Accordingly, CuW has widely been used as a material of a submount for a high-power semiconductor laser. However, any material that exhibits higher heat dissipation performance than CuW is needed to output a power that is higher than 20 W.

Patent Literature 2 discloses embodiments stacking a diamond submount, a silicon carbide (SiC) submount, or the like in order to improve heat dissipation performance of the submount. However, those submounts have a high electric resistivity (e.g., $10^{-4}$ $\Omega$m). Therefore, if an electric current is supplied to a laser diode through those submounts, that an optical output cannot efficiently be obtained because the electric resistance of the entire laser module is increased.

Furthermore, Patent Literature 3 discloses embodiments using vapor-deposited diamond or cBN (cubic boron nitride) as a material for a submount (see paragraphs [0055]-[0057] and FIG. 7). However, both of vapor-deposited diamond and cBN have a high electric resistivity. With a submount made of such a material, the electric resistance of the entire laser module is increased as with the submounts of Patent Literature 2, so that an optical output cannot efficiently abe obtained.

PRIOR ART LITERATURE

Patent Literature
  Patent Literature 1: JP 2005-026333 A
  Patent Literature 2: JP 11-307875 A
  Patent Literature 3: JP 7-176820 A

SUMMARY OF THE INVENTION

Problem(s) to be Solved by the Invention

The present invention has been made in view of the above drawbacks in the prior art. It is, therefore, a first object of the present invention to provide a semiconductor laser module capable of maintaining efficient output characteristics.

Furthermore, a second object of the present invention is to provide a method of manufacturing a semiconductor laser module that can manufacture a semiconductor laser module capable of maintaining efficient output characteristics by a simple process.

Means for Solving Problem(s)

According to a first aspect of the present invention, there is provided a semiconductor laser module that can achieve both of reduction in electric resistance and improvement of the heat dissipation performance and can thus maintain good output characteristics. This semiconductor laser module has an electrically conductive heat sink, a submount disposed above the heat sink, a semiconductor laser device disposed above the submount, and an electrically conductive portion electrically connected to the semiconductor laser device and the heat sink. The electrically conductive portion extends along a surface of the submount to the heat sink and has an electric resistivity lower than an electric resistivity of the submount.

Thus, the electric resistivity of the electrically conductive portion is lower than the electric resistivity of the submount. Therefore, an electric current to be supplied to the semiconductor laser device flows from the heat sink through the electrically conductive portion to the semiconductor laser device. Accordingly, the electric resistivity of the submount does not need to be reduced, and a material having a low electric resistivity does not need to be used. Consequently, the material for the submount can be selected in view of high heat dissipation performance. In this manner, when a material that exhibits high heat dissipation performance is selected for the submount, heat generated in the semiconductor laser device is transmitted through the submount to the heat sink and dissipated by the heat sink. According to the present invention, a path for electric current and a path for heat can be separated from each other between the semiconductor laser device and the heat sink. Thus, the electric resistance of the entire semiconductor laser module can be reduced, and efficient output characteristics of the semiconductor laser module can be maintained.

Furthermore, in order to improve the heat dissipation performance of the semiconductor laser device and to prevent the output characteristics of the semiconductor laser device from being deteriorated, the submount may preferably have a heat conductivity higher than a heat conductivity of the electrically conductive portion.

The electrically conductive portion may be formed of an upper solder layer extending from the semiconductor laser device to the heat sink along the surface of the submount. In this case, at least part of an edge portion of an upper surface of the submount may be rounded or chamfered.

The electrically conductive portion may include an upper solder layer electrically connected to the semiconductor laser device, a lower solder layer formed between the submount and the heat sink, and a plating layer formed on at least a side surface of the submount for electrically connecting the upper solder layer and the lower solder layer to each other.

Alternatively, the electrically conductive portion may include an upper solder layer electrically connected to the semiconductor laser device and an auxiliary conductive layer electrically connecting the upper solder layer and the heat sink to each other. In this case, the auxiliary conductive layer may preferably have a melting point lower than a melting point of the upper solder layer.

According to a second aspect of the present invention, there is provided a method of manufacturing a semiconductor laser module that can manufacture a semiconductor laser module capable of maintaining efficient output characteristics by a simple process. This method is used to manufacture a semiconductor laser module having an electrically conductive heat sink, a submount disposed above the heat sink, and a semiconductor laser device disposed above the submount. In this method, an electrically conductive portion having an electric resistivity lower than an electric resistivity of the submount is formed so as to extend from the semiconductor laser device to the heat sink along a surface of the submount for electrically connecting the semiconductor laser device and the heat sink to each other.

Thus, the electrically conductive portion having an electric resistance lower than an electric resistivity of the submount is formed so as to extend from the semiconductor laser device to the heat sink along the surface of the submount. Therefore, an electric current to be supplied to the semiconductor laser device flows from the heat sink through the electrically conductive portion to the semiconductor laser device. Accordingly, the electric resistivity of the submount does not need to be reduced, and a material having a low electric resistivity does not need to be used. Consequently, the material for the submount can be selected in view of high heat dissipation performance. In this manner, when a material that exhibits high heat dissipation performance is selected for the submount, heat generated in the semiconductor laser device is transmitted through the submount to the heat sink and dissipated by the heat sink. In the semiconductor laser module manufactured according to the present invention, a path for electric current and a path for heat can be separated from each other between the semiconductor laser device and the heat sink. Thus, the electric resistance of the entire semiconductor laser module can be reduced. Hence, a semiconductor laser module that can maintain efficient output characteristics can be manufactured by a simple process.

The forming of the electrically conductive portion may be conducted by forming an upper solder layer connected to the semiconductor laser device on the submount, and, while heating the upper solder layer, pressing the semiconductor laser device against the submount so as to allow the upper solder layer melted by the heating to flow to an lower end of the submount. In this case, the heating of the upper solder layer may be conducted by heating the heat sink. Furthermore, in order that the upper solder layer should be likely to flow down to the lower end of the submount, at least part of an edge portion of an upper surface of the submount may preferably be rounded or chamfered.

The forming of the electrically conductive portion may be conducted by forming a lower solder layer between the heat sink and the submount, forming a plating layer on at least a side surface of the submount, disposing the submount on the lower solder layer so that the plating layer is electrically connected to the lower solder layer, and forming an upper solder layer electrically connected to the plating layer and the semiconductor laser device.

Alternatively, the forming of the electrically conductive portion may be conducted by forming a lower solder layer between the heat sink and the submount, forming an upper solder layer electrically connected to the semiconductor laser device on the submount, and forming an auxiliary conductive layer electrically connecting the upper solder layer and the heat sink to each other. In this case, the auxiliary conductive layer may preferably have a melting point lower than a melting point of the upper solder layer.

Advantageous Effects of the Invention

Thus, the electric resistivity of the electrically conductive portion is lower than the electric resistivity of the submount. Therefore, an electric current to be supplied to the semiconductor laser device flows from the heat sink through the electrically conductive portion to the semiconductor laser device. Accordingly, the electric resistivity of the submount does not need to be reduced, and a material having a low electric resistivity does not need to be used. Consequently, the material for the submount can be selected in view of high heat dissipation performance. In this manner, when a material that exhibits high heat dissipation performance is selected for the submount, heat generated in the semiconductor laser device is transmitted through the submount to the heat sink and dissipated by the heat sink. According to the present invention, a path for electric current and a path for heat can be separated from each other between the semiconductor laser device and the heat sink. Thus, the electric resistance of the entire semiconductor laser module can be reduced, and efficient output characteristics of the semiconductor laser module can be maintained.

MODE(S) FOR CARRYING OUT THE INVENTION

Figure 1:
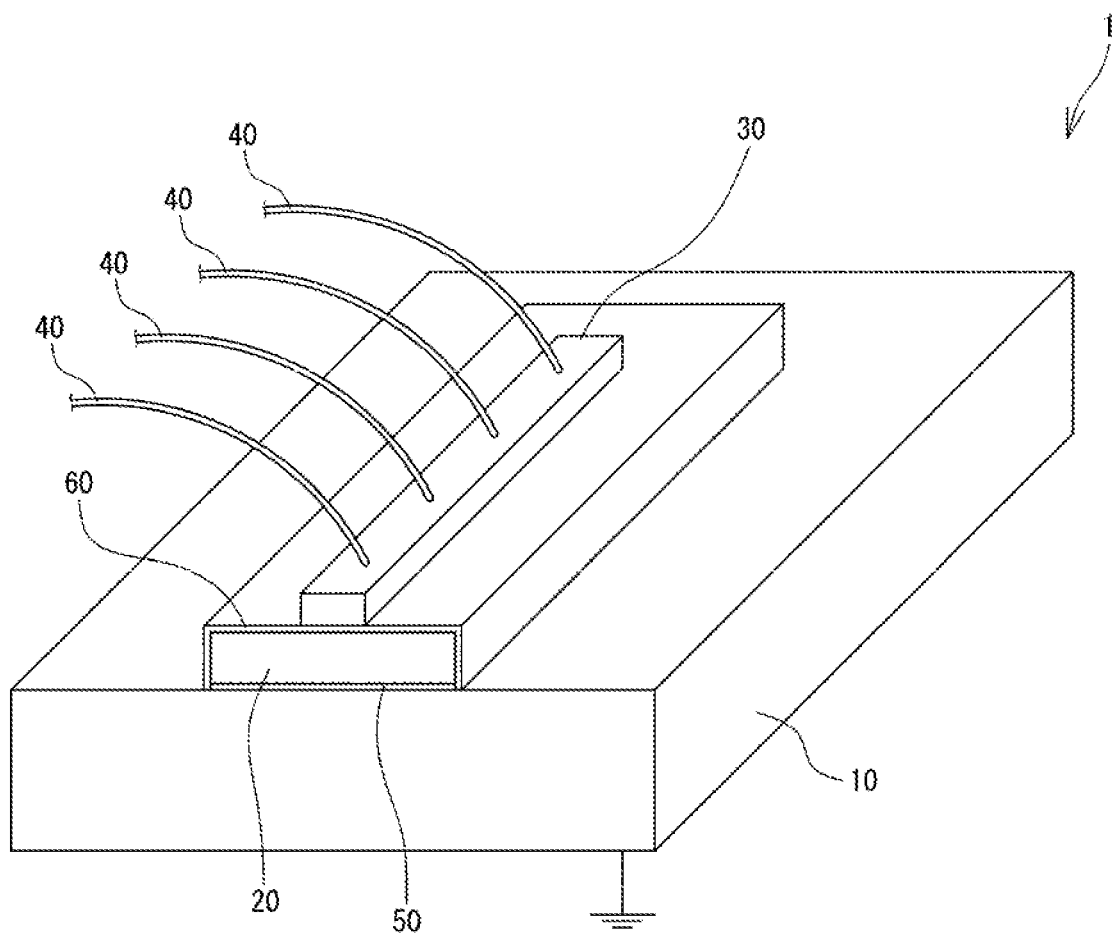
FIG. 1 is a perspective view schematically showing a semiconductor laser module according to a first embodiment of the present invention.

Embodiments of a semiconductor laser module according to the present invention will be described in detail below with reference to FIGS. 1 to 15. In FIGS. 1 to 15, the same or corresponding components are denoted by the same or corresponding reference numerals and will not be described below repetitively. Furthermore, in FIGS. 1 to 15, the scales or dimensions of components may be exaggerated, or some components may be omitted.

FIG. 1 is a perspective view schematically showing a semiconductor laser module 1 according to a first embodiment of the present invention. As shown in FIG. 1, the semiconductor laser module 1 of the present embodiment has a heat sink 10 formed of a material having a high heat conductivity and an electrical conductivity, such as copper, a submount 20 disposed on the heat sink 10, a semiconductor laser device (laser diode) 30 mounted on the submount 20, and bonding wires 40 connecting the semiconductor laser device 30 and leads (not shown) to each other for allowing an electric current to flow from the semiconductor laser device 30. For example, the semiconductor laser device 30 is formed of a high-power semiconductor laser diode made of gallium arsenide (GaAs). For example, the submount 20 is formed of a copper-diamond composite material (CuC). This copper-diamond composite material includes diamond particles dispersed in Cu and has a thermal expansion coefficient of about 6.0 ppm/K. In the present embodiment, the heat sink 10 is grounded.

Figure 2:
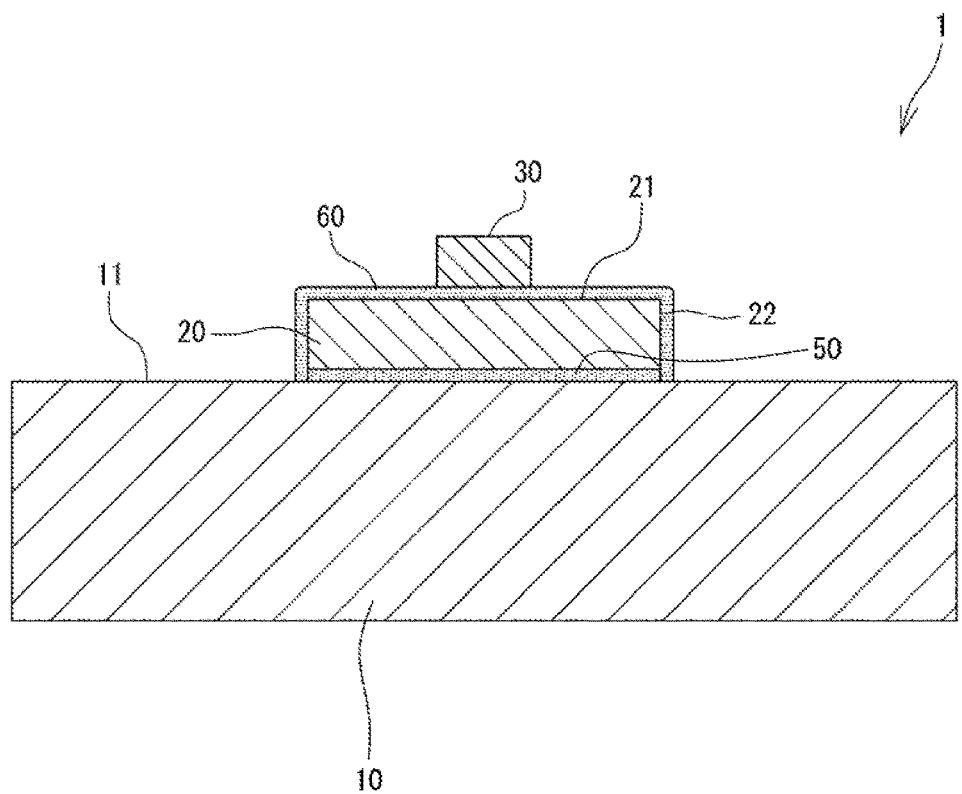
FIG. 2 is a cross-sectional view of the semiconductor laser module illustrated in FIG. 1.

FIG. 2 is a cross-sectional view of the semiconductor laser module 1 illustrated in FIG. 1. As shown in FIG. 2, a lower solder layer 50, which is made of Au-Sn solder, for example, is formed between the submount 20 and the heat sink 10. Furthermore, an upper solder layer 60, which is made of Au-Sn solder, for example, is formed between the semiconductor laser device 30 and the submount 20. The upper solder layer 60 extends from between the semiconductor laser device 30 and the submount 20 to an upper surface 11 of the heat sink 10 along surfaces of the submount 20. In other words, the upper solder layer 60 is formed so as to cover an upper surface 21 and side surfaces 22 of the submount 20. An electrode (not shown) is formed on a bottom surface of the semiconductor laser device 30. The electrode of the semiconductor laser device 30 and the heat sink 10 are electrically connected to each other by the upper solder layer 60. Thus, the upper solder layer 60 of the present embodiment forms an electrically conductive portion extending from the semiconductor laser device 30 to the heat sink 10 along the surfaces (the upper surface 21 and the side surfaces 22) of the submount 20. This electrically conductive portion may not be present between the semiconductor laser device 30 and the submount 20 as long as it is electrically connected to the electrode of the semiconductor laser device 30.

The materials of the submount 20 and the upper solder layer 60 are selected such that the heat conductivity of the submount 20 is higher than the heat conductivity of the upper solder layer 60 and that the electric resistivity of the upper solder layer 60 is lower than the electric resistivity of the submount. In the present embodiment, as described above, a copper-diamond composite material is used as a material for the submount 20, and Au-Sn solder is used as a material for the upper solder layer 60.

Figure 3:
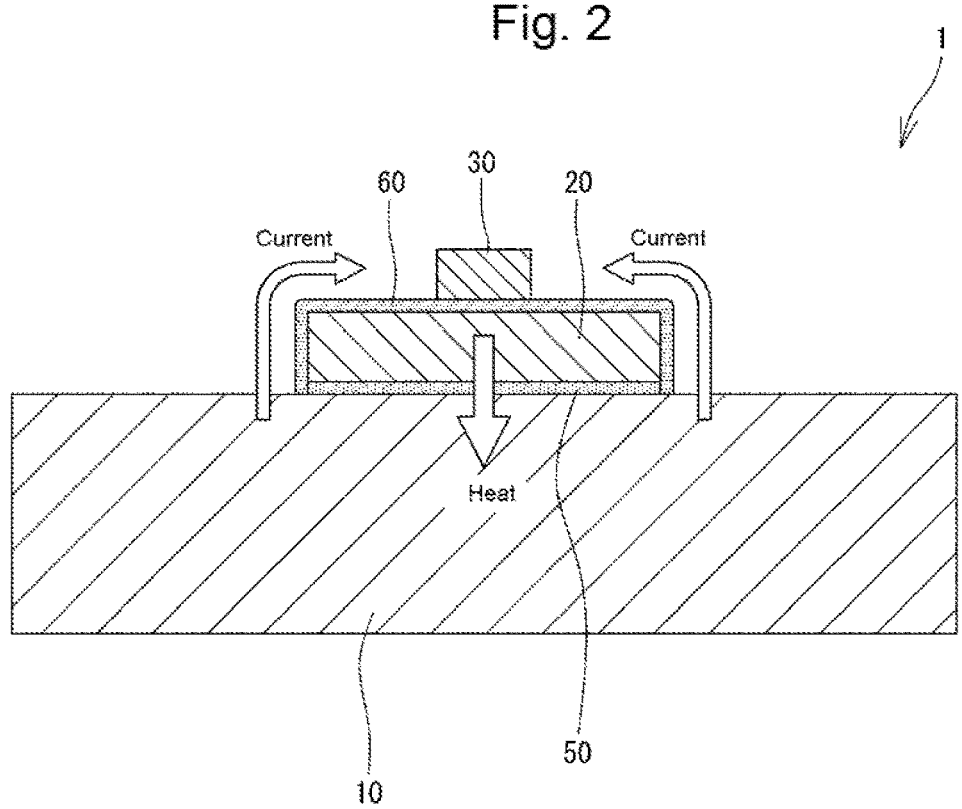
FIG. 3 is a schematic diagram showing a path of electric current and a path of heat in the semiconductor laser module illustrated in FIG. 2.

Thus, the electric resistivity of the upper solder layer 60 is lower than the electric resistivity of the submount 20. Therefore, as shown in FIG. 3, an electric current to be supplied to the semiconductor laser device 30 flows from the heat sink 10 through the upper solder layer 60 to the semiconductor laser device 30. Accordingly, as described above, a material having a high heat conductivity can be used for the submount 20. As a result, it is not necessary to select a material having a low electric resistivity for the submount 20. For example, even an electrical insulator may be used as the submount 20 if it has a high heat conductivity.

In this manner, the heat conductivity of the submount 20 can be made higher than the heat conductivity of the upper solder layer 60. Therefore, heat generated in the semiconductor laser device 30 is transmitted through the submount 20 to the heat sink 10 and dissipated by the heat sink 10. In this manner, a path for electric current and a path for heat can be separated from each other between the semiconductor laser device 30 and the heat sink 10. Thus, the heat dissipation performance of the semiconductor laser module 1 can be improved while the electric resistance of the entire semiconductor laser module 1 can be reduced. Hence, the output characteristics of the semiconductor laser device 30 can be prevented from being deteriorated, so that efficient output characteristics of the semiconductor laser module can be maintained.

Figure 4A:
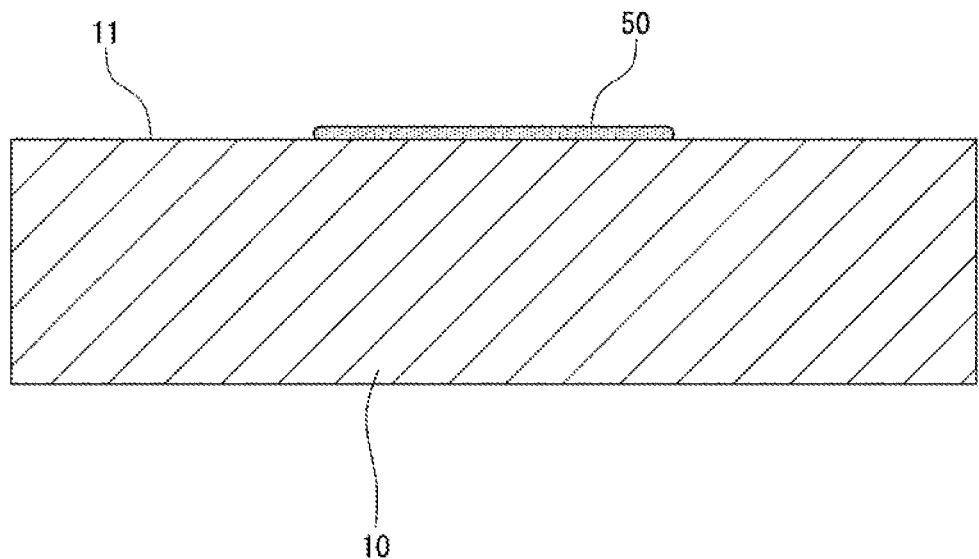
FIG. 4A is a cross-sectional view showing a manufacturing process of the semiconductor laser module illustrated in FIG. 1.
Figure 4B:
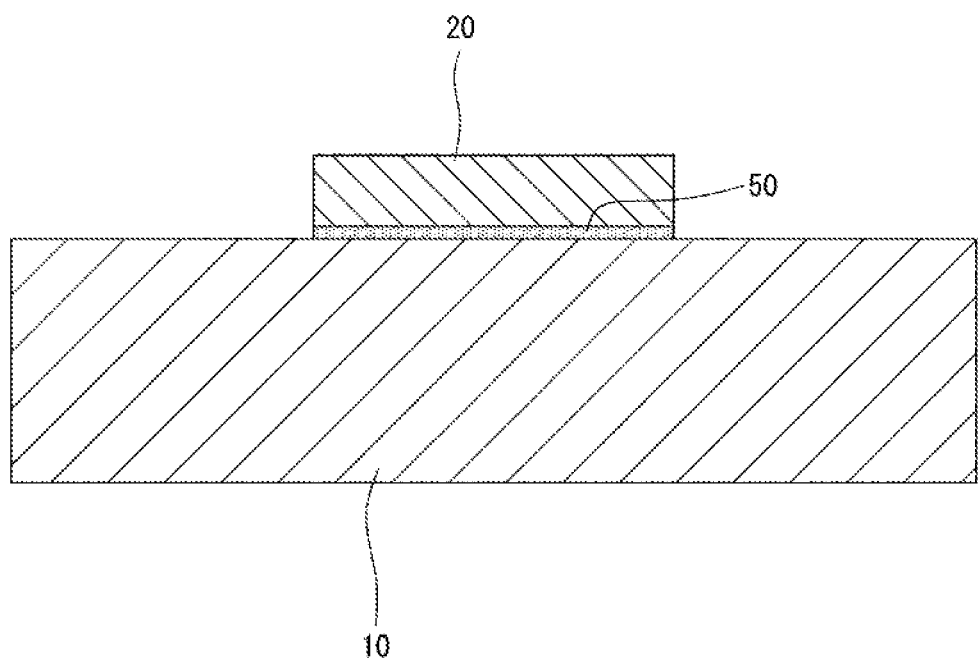
FIG. 4B is a cross-sectional view showing a manufacturing process of the semiconductor laser module illustrated in FIG. 1.

Next, a method of manufacturing such a semiconductor laser module 1 will be described with reference to FIGS. 4A to 4F. First, as shown in FIG. 4A, a lower solder layer 50 of Au-Sn solder, for example, is deposited on a predetermined submount area of an upper surface 11 of a heat sink 10. Then, as shown in FIG. 4B, a submount 20 is disposed on the lower solder layer 50 deposited on the heat sink 10.

Figure 4C:
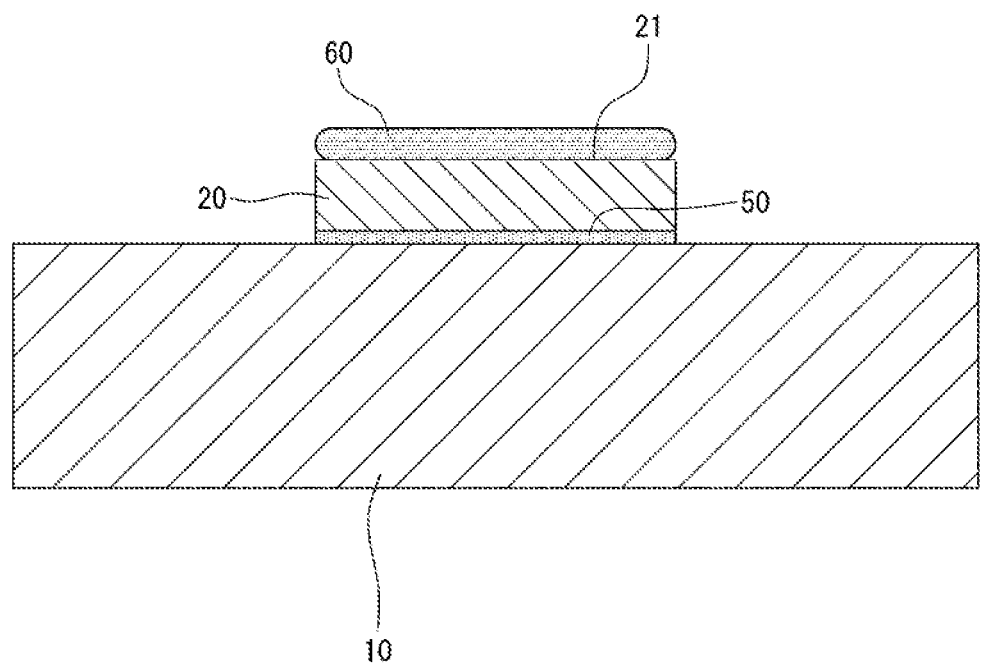
FIG. 4C is a cross-sectional view showing a manufacturing process of the semiconductor laser module illustrated in FIG. 1.
Figure 4D:
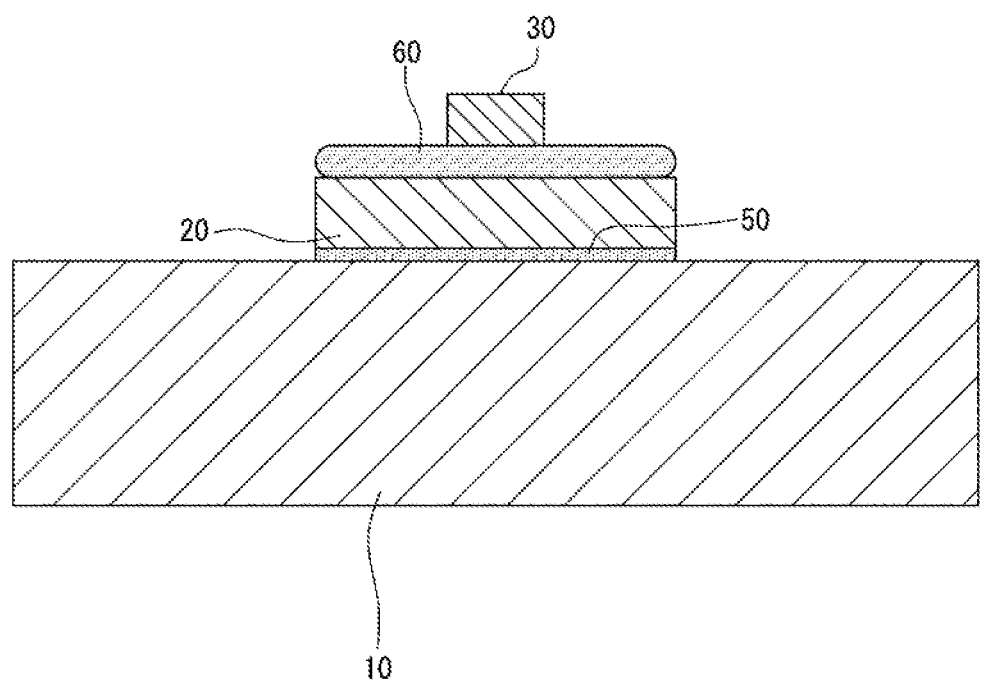
FIG. 4D is a cross-sectional view showing a manufacturing process of the semiconductor laser module illustrated in FIG. 1.

Thereafter, as shown in FIG. 4C, an upper solder layer 60 of Au-Sn solder, for example, is deposited on a predetermined device area of an upper surface 21 of the submount 20. The thickness of the upper solder layer 60 at that time is greater than the thickness of the upper solder layer 60 in the completed semiconductor laser module 1 as shown in FIG. 2. Then, as shown in FIG. 4D, a semiconductor laser device 30 is disposed on the upper solder layer 60. At that time, the semiconductor laser device 30 is arranged such that an electrode (not shown) on the bottom surface of the semiconductor laser device 30 is brought into contact with the upper solder layer 60.

Figure 4E:
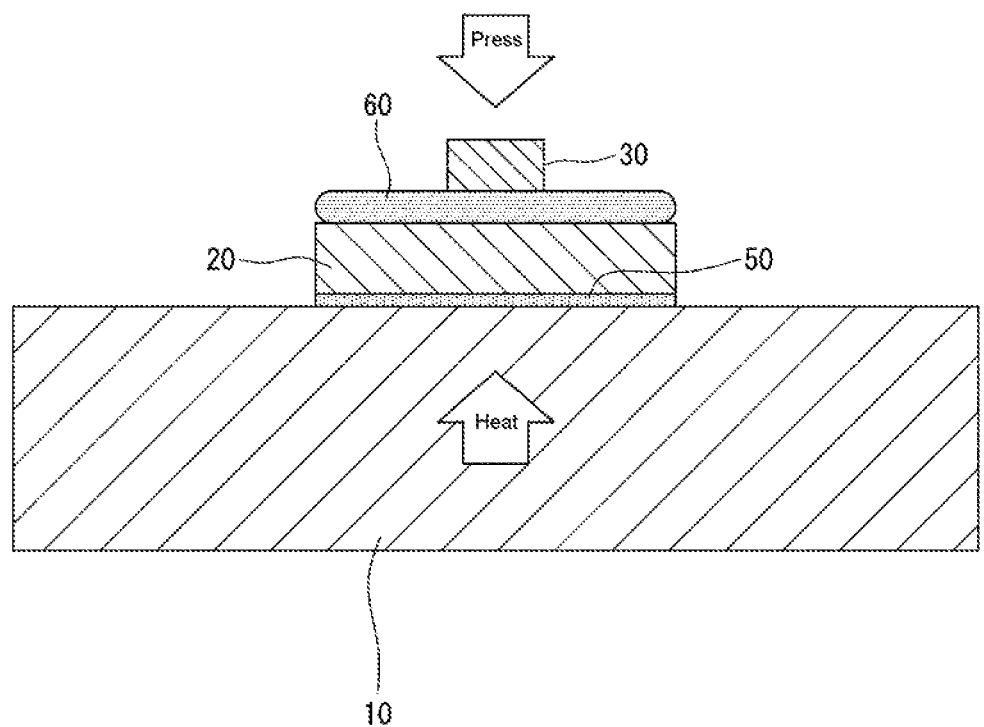
FIG. 4E is a cross-sectional view showing a manufacturing process of the semiconductor laser module illustrated in FIG. 1.
Figure 4F:
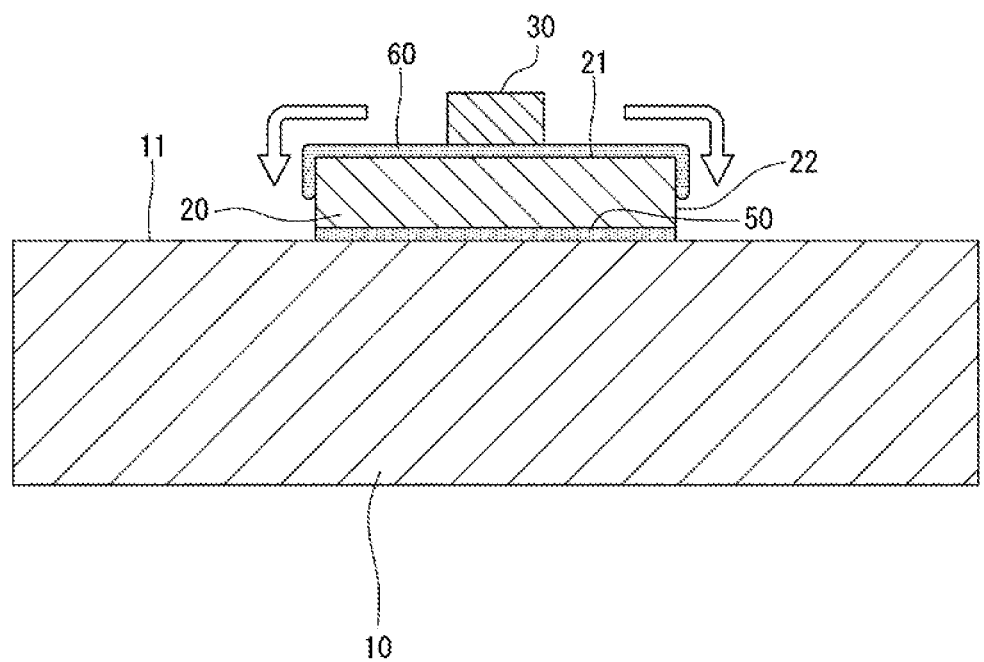
FIG. 4F is a cross-sectional view showing a manufacturing process of the semiconductor laser module illustrated in FIG. 1.

Then, as shown in FIG. 4E, the heat sink 10 is heated to heat the lower solder layer 50 and to heat the upper solder layer 60 via the submount 20. This heating causes the lower solder layer 50 and the upper solder layer 60 to be melted. At that time, the semiconductor laser device 30 is pressed against the submount 20. Thus, the submount 20 is fixed onto the heat sink 10 by the lower solder layer 50, and the semiconductor laser device 30 is fixed onto the submount 20 by the upper solder layer 60.

When the semiconductor laser device 30 is pressed against the submount 20, the melted upper solder layer 60 spreads around the semiconductor laser device 30 and flows down on the surfaces (upper surface 21 and side surfaces 22) of the submount 20. Eventually, the melted upper solder layer 60 flows down onto a lower end of the submount 20, i.e., the upper surface 11 of the heat sink 10. The upper solder layer 60 that has flowed down forms an electrically conductive portion extending from the semiconductor laser device 30 to the heat sink 10 along the surfaces (the upper surface 21 and the side surfaces 22) of the submount 20. In this manner, a semiconductor laser module 1 as illustrated in FIG. 1 is completed.

In the example illustrated in FIGS. 4A to 4F, the lower solder layer 50 and the upper solder layer 60 are simultaneously heated to fix the semiconductor laser device 30 to the submount 20 and the submount 20 to the heat sink 10 at the same time. Nevertheless, the semiconductor laser device 30 may be fixed to the submount 20 after the submount 20 has been fixed to the heat sink 10.

Alternatively, the semiconductor laser device 30 and the submount 20 may be fixed to the heat sink 10 after the semiconductor laser device 30 has been fixed to the submount 20. In this case, the semiconductor laser device 30 is first disposed on the upper solder layer 60, which has been deposited on the submount 20. Then the upper solder layer 60 is heated and melted. The semiconductor laser device 30 is pressed against the submount 20, so that the melted upper solder layer 60 flows down to the end of the submount 20 along the surfaces (the upper surface 21 and the side surfaces 22) of the submount 20. In that state, the semiconductor laser device 30 and the submount 20 are fixed together. Thereafter, the submount 20 and the semiconductor laser device 30 are disposed on the lower solder layer 50, which has been deposited on the heat sink 10. The lower solder layer 50 is heated to fix the heat sink 10 and the submount 20 together. In this case, the melting point of the lower solder layer 50 is preferably lower than the melting point of the upper solder layer 60.

Figure 5:
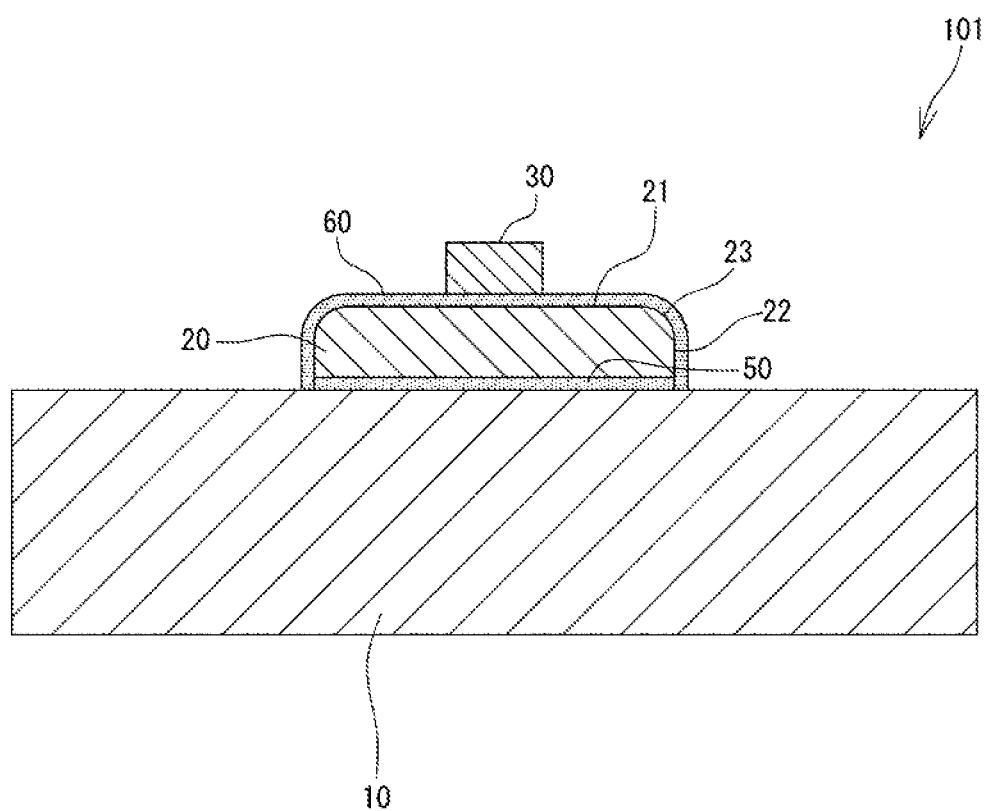
FIG. 5 is a cross-sectional view schematically showing a semiconductor laser module according to a second embodiment of the present invention.

FIG. 5 is a cross-sectional view schematically showing a semiconductor laser module 101 according to a second embodiment of the present invention. In the present embodiment, an edge portion 23 of the upper surface 21 of the submount 20 is rounded. When the edge portion 23 of the upper surface 21 of the submount 20 is thus rounded, a solder layer melted on the submount 20 is likely to flow down from the upper surface 21 to the side surfaces 22 of the submount 20. Therefore, an electrically conductive portion cam more readily be formed by the upper solder layer 60. FIG. 5 illustrates that the entire edge portion 23 of the upper surface 21 of the submount 20 is rounded. However, at least part of the edge portion 23 of the upper surface 21 of the submount 20 may be rounded. Furthermore, at least part of the edge portion 23 of the upper surface 21 of the submount 20 may be chamfered to obtain the same effects.

Figure 6:
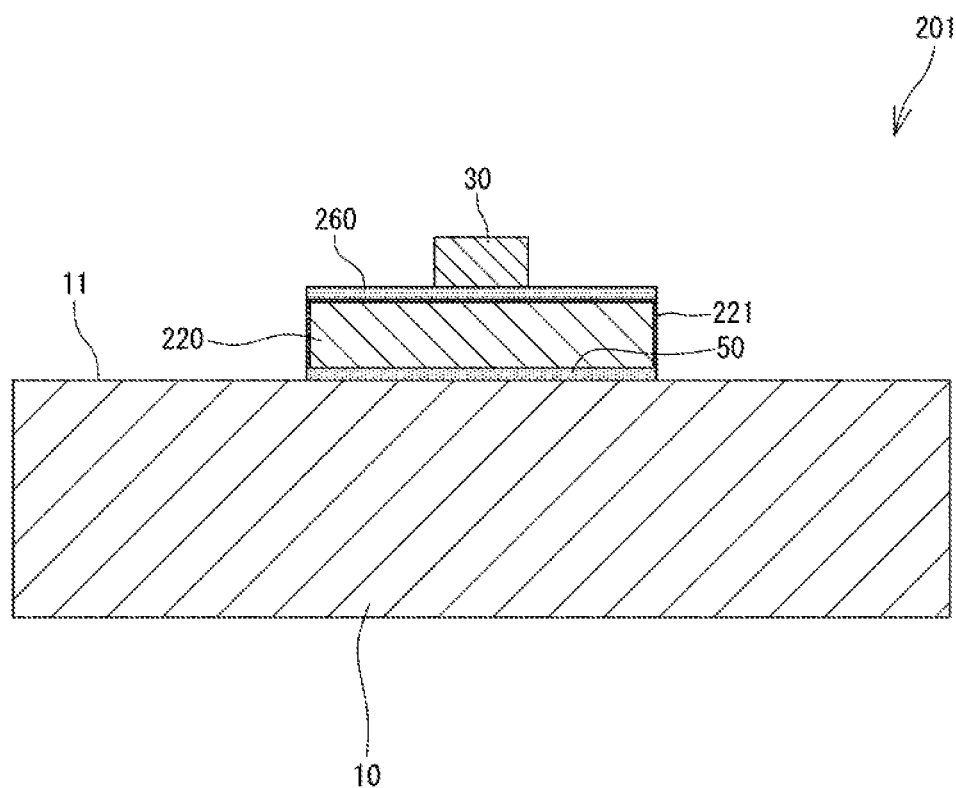
FIG. 6 is a cross-sectional view schematically showing a semiconductor laser module according to a third embodiment of the present invention.

FIG. 6 is a cross-sectional view schematically showing a semiconductor laser module 201 according to a third embodiment of the present invention. As shown in FIG. 6, the semiconductor laser module 201 of the present embodiment has a submount 220 formed of a copper-diamond composite material. A plating layer 221 is formed on an upper surface and side surfaces of the submount 220 by Ni/Au plating.

An upper solder layer 260, which is made of Au-Sn solder, for example, is formed between the semiconductor laser device 30 and the submount 220. Unlike the upper solder layer 60 of the first embodiment, the upper solder layer 260 is formed only on the upper surface of the submount 220. Thus, the upper solder layer 260 does not extend to the upper surface 11 of the heat sink 10.

The upper solder layer 260 is electrically connected to the plating layer 221 of the submount 220, and the plating layer 221 of the submount 220 is electrically connected to the lower solder layer 50, which is formed on the heat sink 10. Therefore, the upper solder layer 260, the plating layer 221 of the submount 220, and the lower solder layer 50 of the present embodiment form an electrically conductive portion extending from the semiconductor laser device 30 to the heat sink 10 along the surfaces of the submount 220. The material for the submount 220 and the material for the electrically conductive portion are selected such that the heat conductivity of the submount 220 is higher than the heat conductivity of the electrically conductive portion and that the electric resistivity of the electrically conductive portion is lower than the electric resistivity of the submount 220.

With such a configuration, an electric current to be supplied to the semiconductor laser device 30 flows from the heat sink 10 through the lower solder layer 50, the plating layer 221, and the upper solder layer 260 to the semiconductor laser device 30. Heat generated in the semiconductor laser device 30 is transmitted through the submount 20 to the heat sink 10 and dissipated by the heat sink 10. In this manner, a path for electric current and a path for heat can be separated from each other between the semiconductor laser device 30 and the heat sink 10. Thus, the heat dissipation performance of the semiconductor laser module 201 can be improved while the electric resistance of the entire semiconductor laser module 201 can be reduced. Hence, the output characteristics of the semiconductor laser device 30 can be prevented from being deteriorated, so that efficient output characteristics of the semiconductor laser module can be maintained. Sufficient effects can be expected if the plating layer 221 has a thickness of about 5 μm. However, the plating layer 221 may have a thickness less than or equal to 5 μm.

Figure 16:
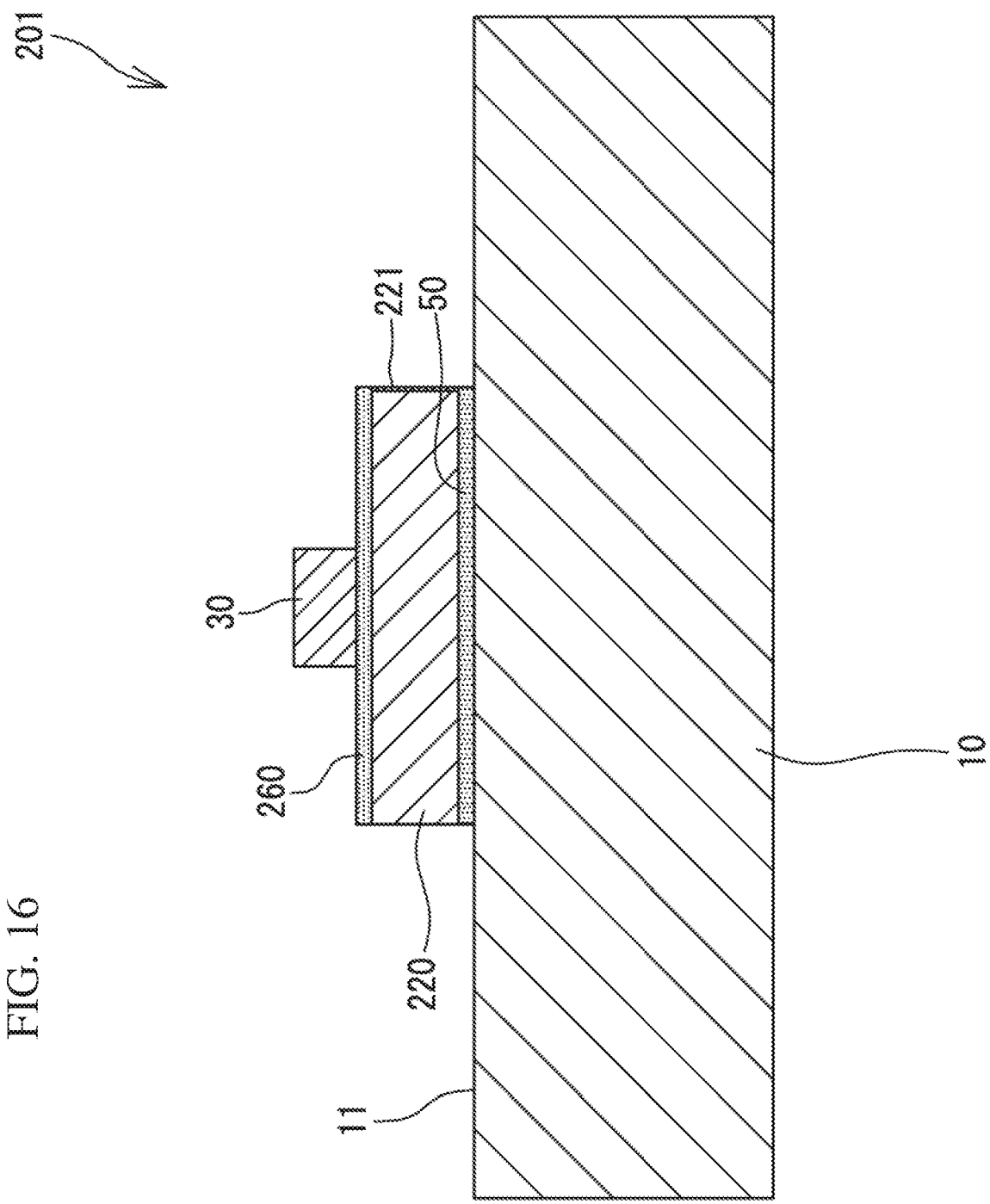
FIG. 16 is a cross-sectional view schematically showing a semiconductor laser module according to further embodiment.

In the aforementioned embodiment, the plating layer 221 is formed on the upper surface and the side surfaces of the submount 220. Nevertheless, similar plating may be conducted on the bottom surface of the submount 220. Furthermore, as shown by FIG. 16, the plating layer 221 may be formed only on a side surface of the submount 220 as long as it is electrically connected to the upper solder layer 260 and the lower solder layer 50.

Figure 7A:
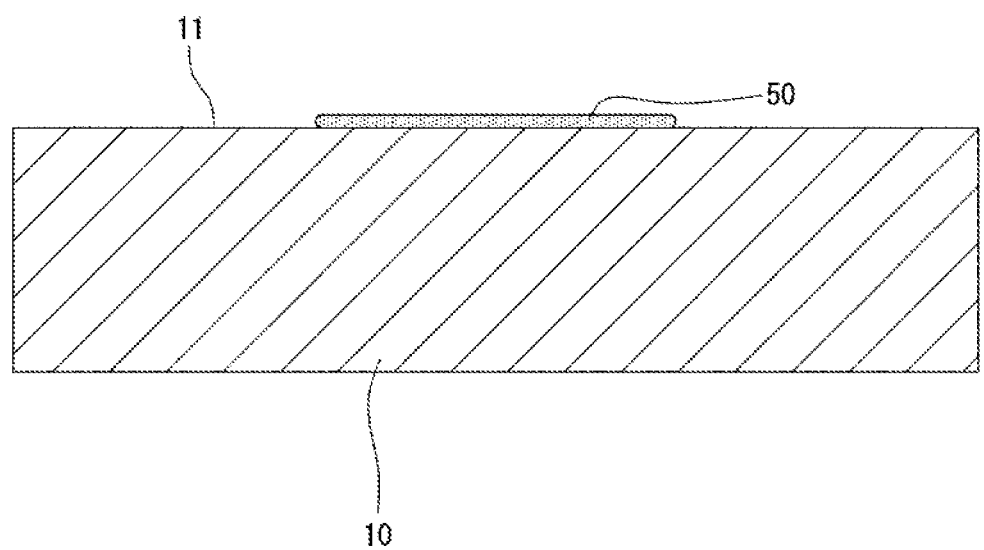
FIG. 7A is a cross-sectional view showing a manufacturing process of the semiconductor laser module illustrated in FIG. 6.
Figure 7B:
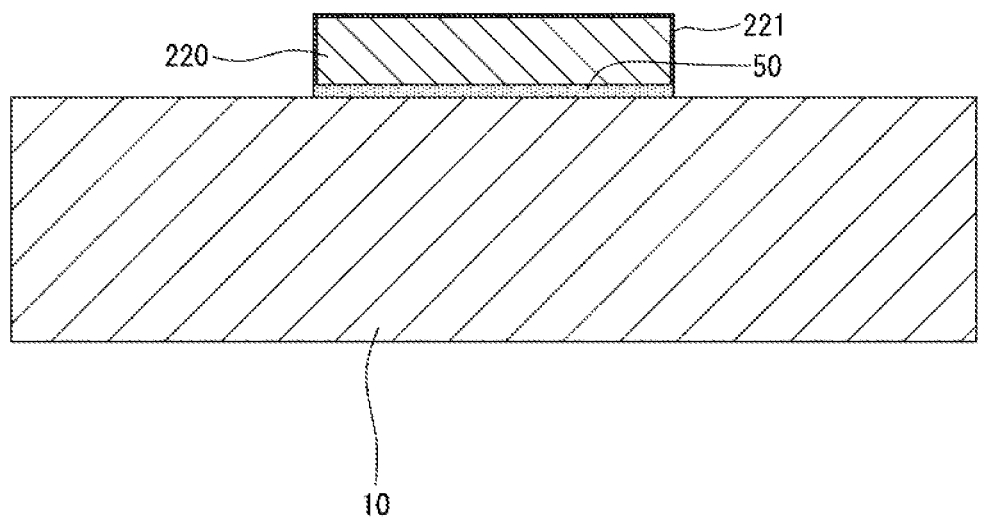
FIG. 7B is a cross-sectional view showing a manufacturing process of the semiconductor laser module illustrated in FIG. 6.

When such a semiconductor laser module 201 is manufactured, as shown in FIG. 7A, a lower solder layer 50 of Au-Sn solder, for example, is deposited on a predetermined submount area of an upper surface 11 of a heat sink 10. Then, as shown in FIG. 7B, a submount 220 having a plating layer 221 that has been formed on an upper surface and side surfaces of the submount 220 is disposed on the lower solder layer 50 formed on the submount area of the heat sink 10. At that time, the submount 220 is disposed on the lower solder layer 50 so that the plating layer 221 is electrically connected to the lower solder layer 50.

Figure 7C:
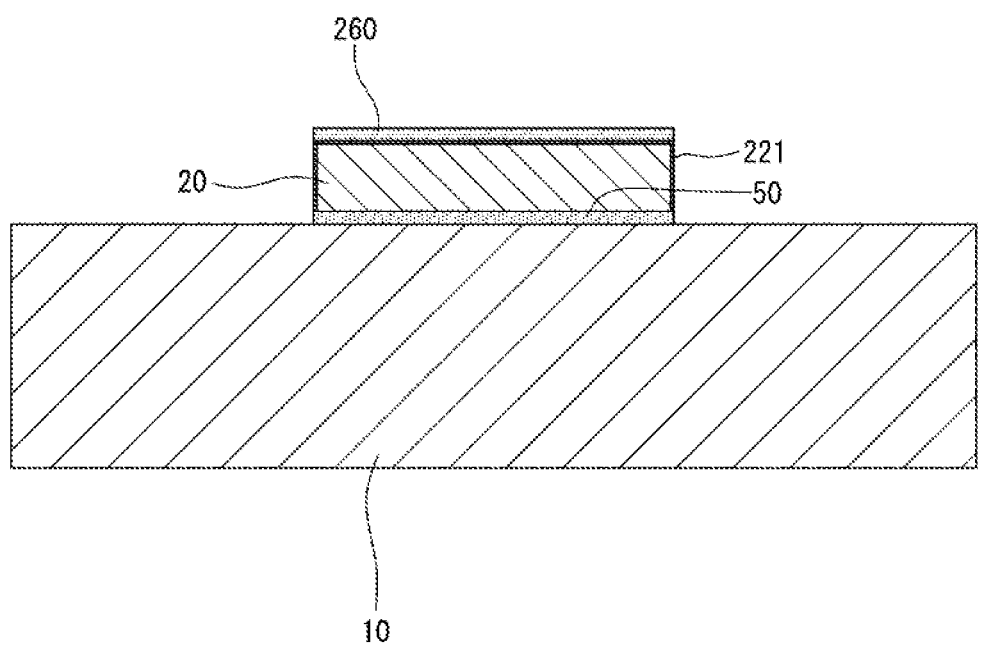
FIG. 7C is a cross-sectional view showing a manufacturing process of the semiconductor laser module illustrated in FIG. 6.
Figure 7D:
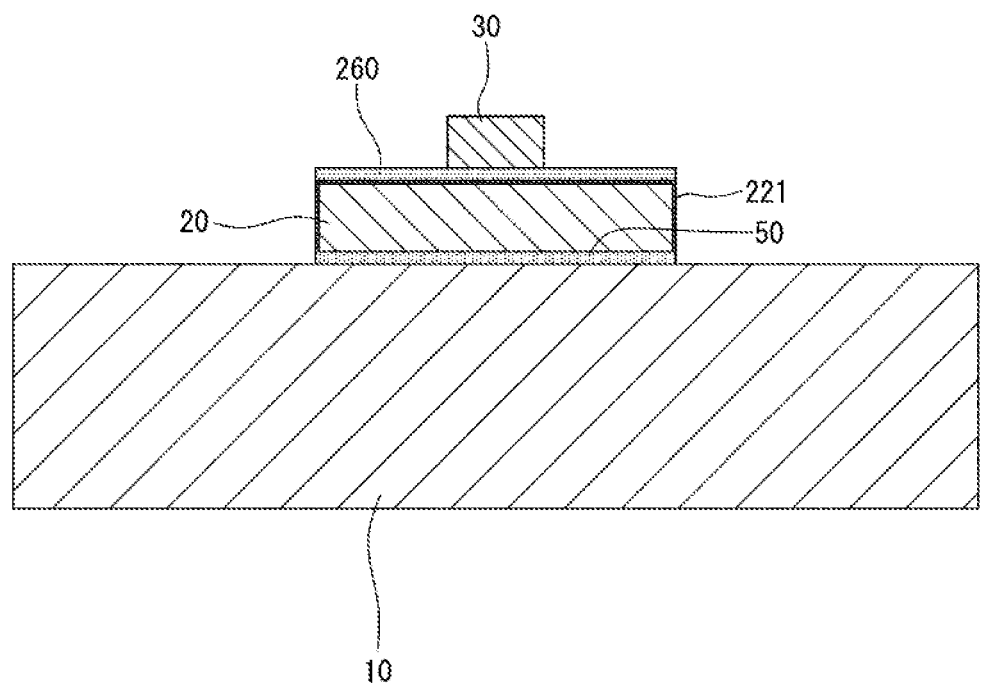
FIG. 7D is a cross-sectional view showing a manufacturing process of the semiconductor laser module illustrated in FIG. 6.

Thereafter, as shown in FIG. 7C, an upper solder layer 260 of Au-Sn solder, for example, is deposited on a predetermined device area of an upper surface of the submount 220. At that time, the upper solder layer 260 is formed so that the upper solder layer 260 is electrically connected to the plating layer 221 and will electrically be connected to a semiconductor laser device 30. Then, as shown in FIG. 7D, the semiconductor laser device 30 is disposed on the upper solder layer 260. At that time, the semiconductor laser device 30 is arranged such that an electrode (not shown) on the bottom surface of the semiconductor laser device 30 is brought into contact with the upper solder layer 260.

Then the heat sink 10 is heated to heat the lower solder layer 50 and to heat the upper solder layer 260 via the submount 220. As a result, the submount 220 is fixed onto the heat sink 10 by the lower solder layer 50, and the semiconductor laser device 30 is fixed onto the submount 20 by the upper solder layer 260. In this manner, a semiconductor laser module 201 as illustrated in FIG. 6 is completed.

Figure 8:
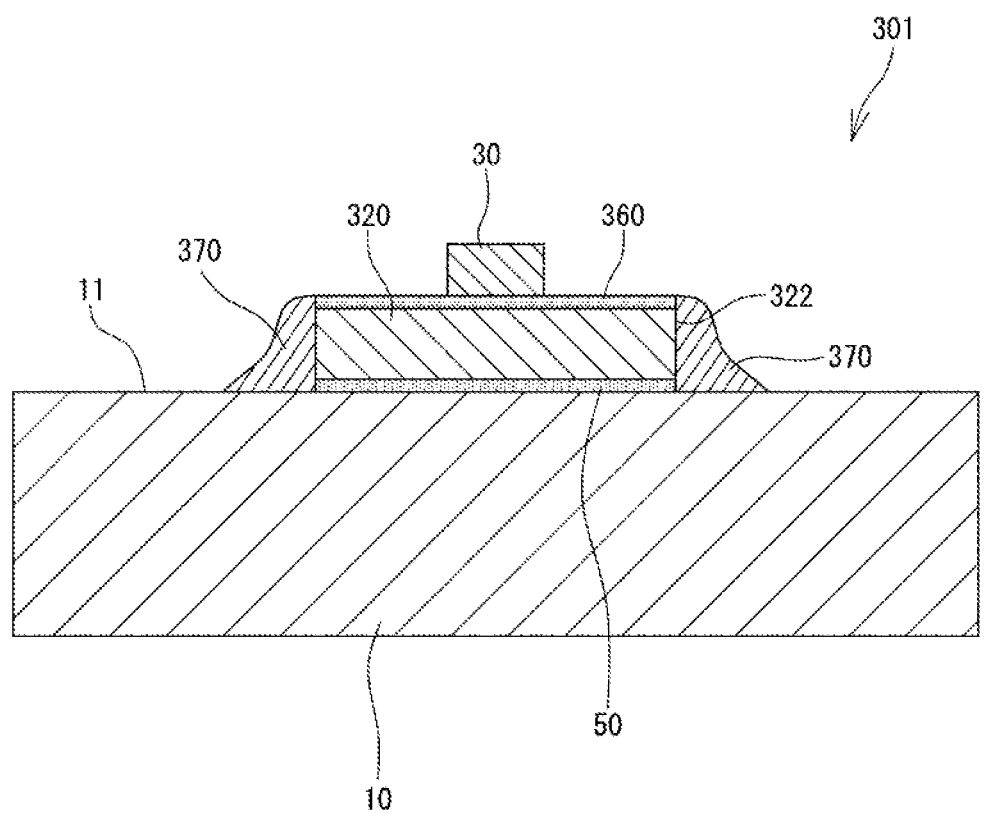
FIG. 8 is a cross-sectional view schematically showing a semiconductor laser module according to a fourth embodiment of the present invention.

FIG. 8 is a cross-sectional view schematically showing a semiconductor laser module 301 according to a fourth embodiment of the present invention. As shown in FIG. 8, the semiconductor laser module 301 of the present embodiment has a heat sink 10 formed of a material having a high heat conductivity and an electrical conductivity, such as copper, a submount 320 disposed on the heat sink 10, and a semiconductor laser device 30 mounted on the submount 320. For example, the submount 320 is formed of a copper-diamond composite material.

A lower solder layer 50, which is made of Au-Sn solder, for example, is formed between the submount 320 and the heat sink 10. Furthermore, an upper solder layer 360, which is made of Au-Sn solder, for example, is formed between the semiconductor laser device 30 and the submount 320. The upper solder layer 360 is formed only on the upper surface of the submount 320. Thus, the upper solder layer 360 does not extend to an upper surface 11 of the heat sink 10.

Furthermore, an auxiliary conductive layer 370 is formed so as to cover side surfaces 322 of the submount 320. For example, the auxiliary conductive layer 370 can be formed of solder having a melting point lower than those of the lower solder layer 50 and the upper solder layer 360, such as Sn—Ag—Cu solder. The form of the auxiliary conductive layer 370 is not limited to Sn-Ag-Cu solder. The auxiliary conductive layer 370 may be formed by application of silver paste or In-based solder.

The auxiliary conductive layer 370 is electrically connected to the upper solder layer 360 and the heat sink 10. Therefore, the upper solder layer 360 and the auxiliary conductive layer 370 of the present embodiment form an electrically conductive portion extending from the semiconductor laser device 30 to the heat sink 10 along surfaces of the submount 320. The materials of the submount 320 and the electrically conductive portion are selected such that the heat conductivity of the submount 320 is higher than the heat conductivity of the electrically conductive portion and that the electric resistivity of the electrically conductive portion is lower than the electric resistivity of the submount 320.

With such a configuration, an electric current to be supplied to the semiconductor laser device 30 flows from the heat sink 10 through the auxiliary conductive layer 370 and the upper solder layer 360 to the semiconductor laser device 30. Heat generated in the semiconductor laser device 30 is transmitted through the submount 320 to the heat sink 10 and dissipated by the heat sink 10. In this manner, a path for electric current and a path for heat can be separated from each other between the semiconductor laser device 30 and the heat sink 10. Thus, the heat dissipation performance of the semiconductor laser module 301 can be improved while the electric resistance of the entire semiconductor laser module 301 can be reduced. Hence, the output characteristics of the semiconductor laser device 30 can be prevented from being deteriorated, so that efficient output characteristics of the semiconductor laser module can be maintained.

Figure 9A:
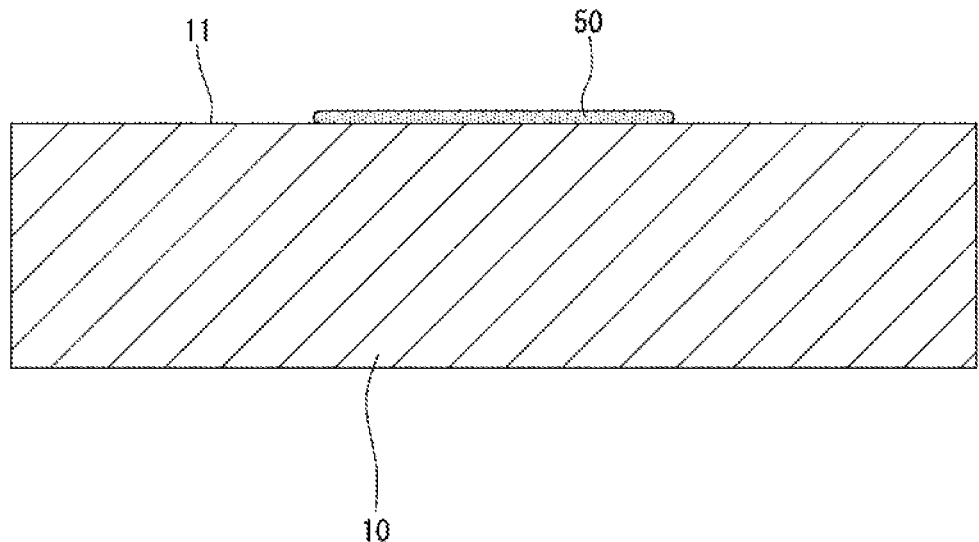
FIG. 9A is a cross-sectional view showing a manufacturing process of the semiconductor laser module illustrated in FIG. 8.
Figure 9B:
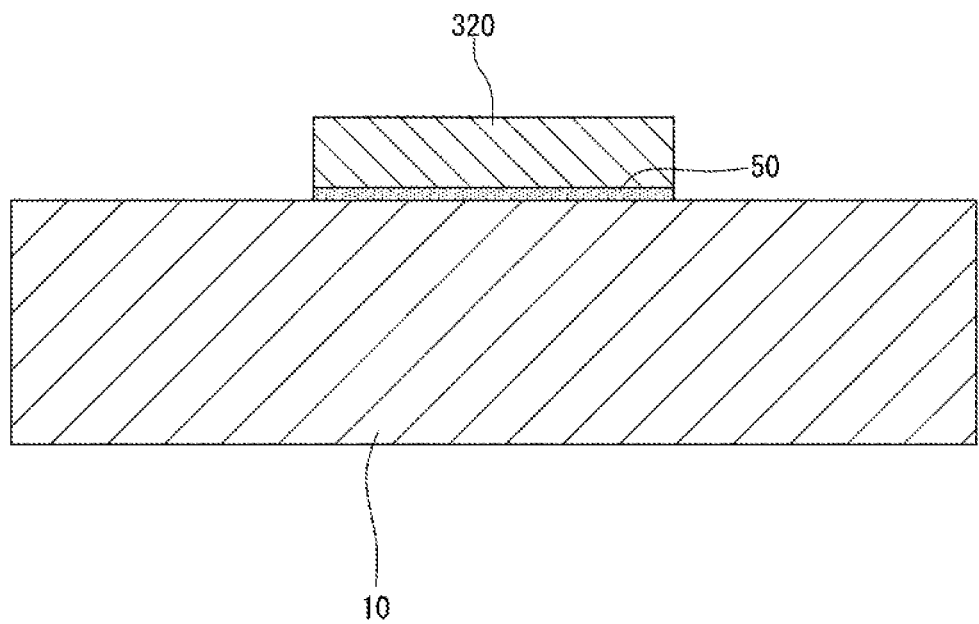
FIG. 9B is a cross-sectional view showing a manufacturing process of the semiconductor laser module illustrated in FIG. 8.

When such a semiconductor laser module 301 is manufactured, as shown in FIG. 9A, a lower solder layer 50 of Au-Sn solder, for example, is deposited on a predetermined submount area of an upper surface 11 of a heat sink 10. Then, as shown in FIG. 9B, a submount 320 is disposed on the lower solder layer 50 formed on the submount area of the heat sink 10.

Figure 9C:
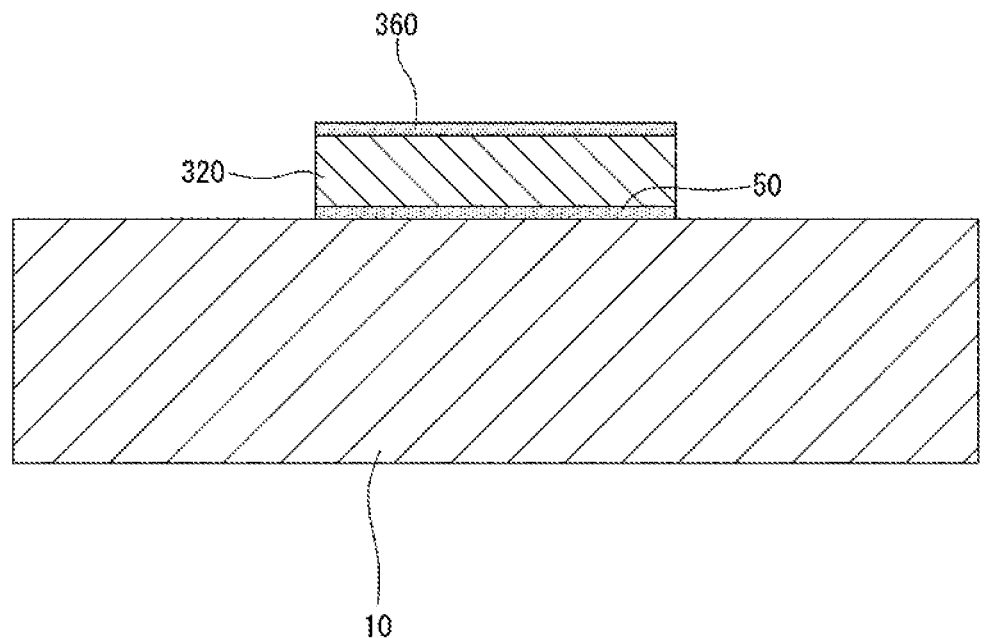
FIG. 9C is a cross-sectional view showing a manufacturing process of the semiconductor laser module illustrated in FIG. 8.
Figure 9D:
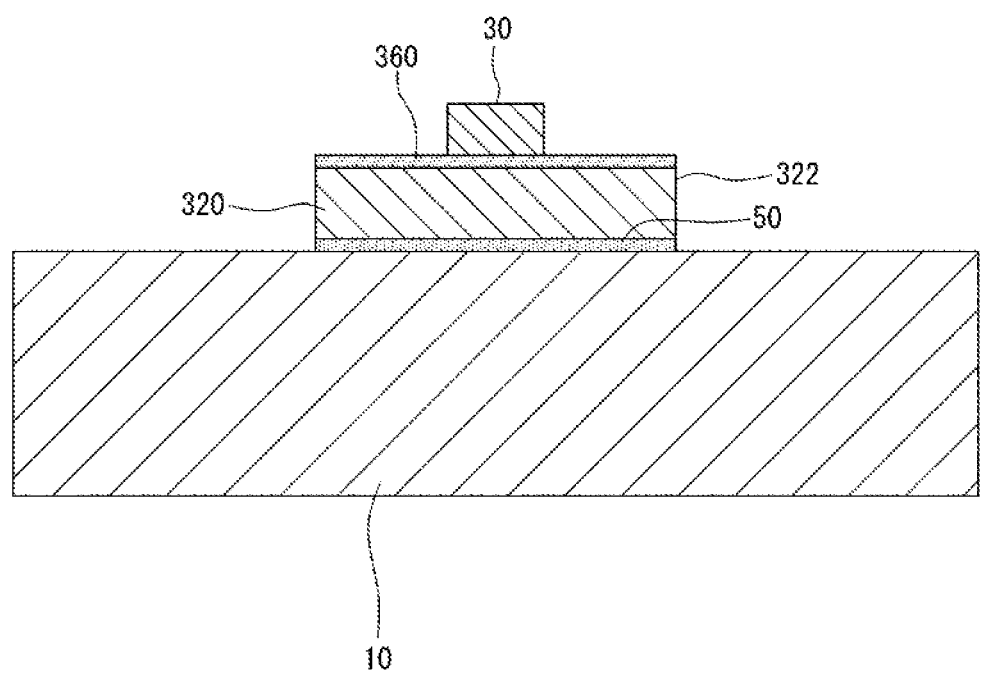
FIG. 9D is a cross-sectional view showing a manufacturing process of the semiconductor laser module illustrated in FIG. 8.

Thereafter, as shown in FIG. 9C, an upper solder layer 360 of Au-Sn solder, for example, is deposited on a predetermined device area of an upper surface 21 of the submount 320. Then, as shown in FIG. 9D, the semiconductor laser device 30 is disposed on the upper solder layer 360. At that time, the semiconductor laser device 30 is arranged such that an electrode (not shown) on the bottom surface of the semiconductor laser device 30 is brought into contact with the upper solder layer 360.

Then the heat sink 10 is heated to heat the lower solder layer 50 and to heat the upper solder layer 360 via the submount 320. As a result, the submount 320 is fixed onto the heat sink 10 by the lower solder layer 50, and the semiconductor laser device 30 is fixed onto the submount 20 by the upper solder layer 360.

After that, an auxiliary conductive layer 370 is formed on side surfaces 322 of the submount 320 so as to electrically connect the upper solder layer 360 and the heat sink 10 to each other. For example, this auxiliary conductive layer 370 is formed of solder having a melting point lower than those of the lower solder layer 50 and the upper solder layer 360, such as Sn-Ag-Cu solder. Such solder having a melting point lower than those of the lower solder layer 50 and the upper solder layer 360 is used in order to prevent the lower solder layer 50 and the upper solder layer 360 from being remelted. In this manner, a semiconductor laser module 301 as illustrated in FIG. 8 is completed.

In the aforementioned embodiments, the electric current is described as flowing from the heat sink 10 to the semiconductor laser device 30. However, the direction in which the electric current flows may be reversed. In other words, an electric current may be supplied from the bonding wire 40 (see FIG. 1) to the semiconductor laser device 30. Thus, an electric current may flow from the semiconductor laser device 30 through the electrically conductive portion to the heat sink 10.

Figure 10:
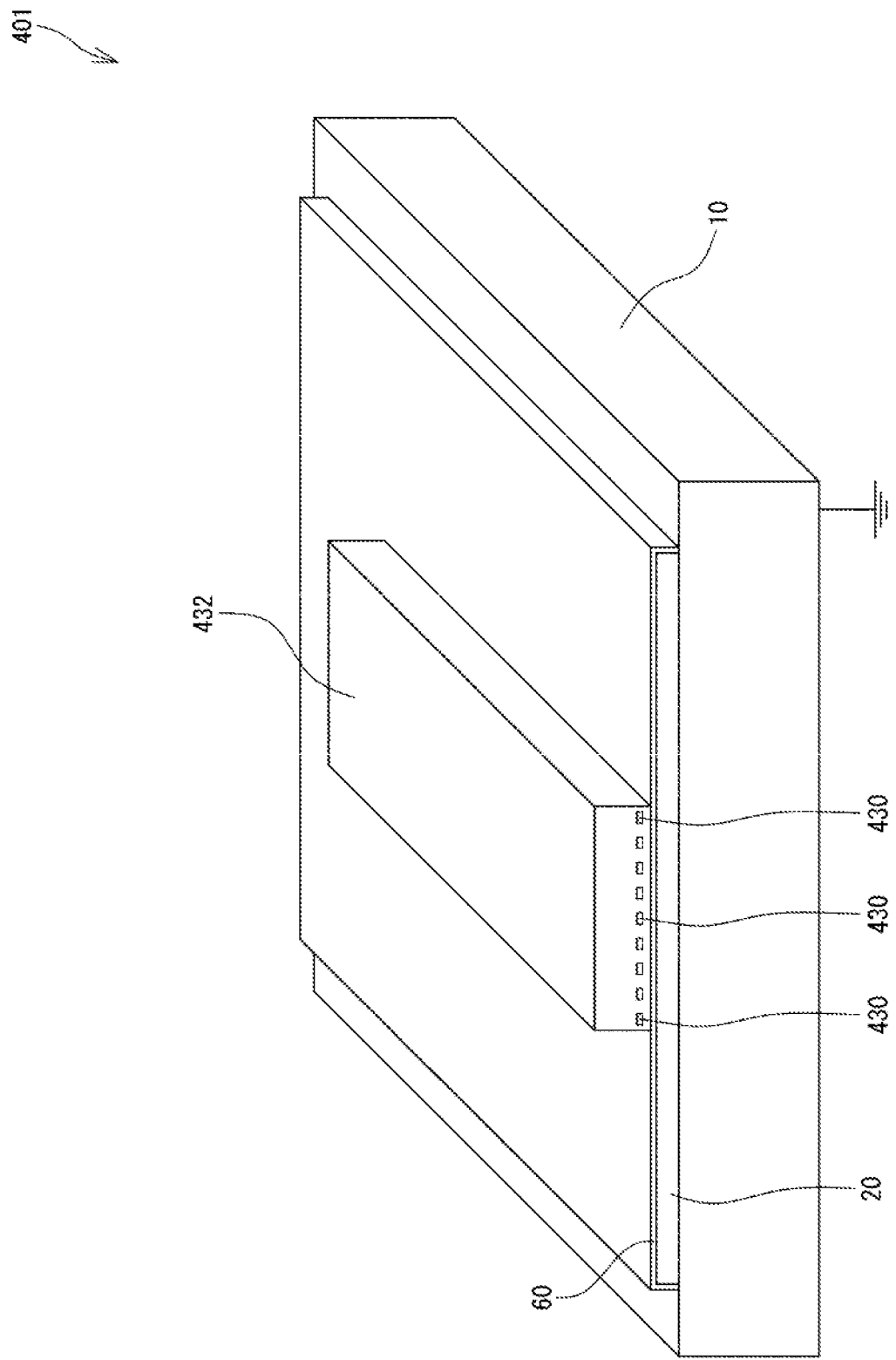
FIG. 10 is a perspective view schematically showing a semiconductor laser module according to another embodiment of the present invention.

The semiconductor laser modules in the aforementioned embodiments include a single semiconductor laser device 30. Nevertheless, the present invention is applicable to a semiconductor laser module including a plurality of semiconductor laser devices. For example, FIG. 10 is a perspective view showing a semiconductor laser module 401 including a plurality of semiconductor laser devices 430. The present invention is applicable to the semiconductor laser module 401 as illustrated in FIG. 10. In the semiconductor laser module 401 shown in FIG. 10, a laser diode bar 432 is disposed above the submount 20. This laser diode bar 432 includes a plurality of semiconductor laser devices 430 arranged at constant intervals along the horizontal direction.

Since the semiconductor laser module 401 includes a plurality of semiconductor laser devices 430, it can output a higher power than the semiconductor laser modules according to the above first to fourth embodiments.

Since such a semiconductor laser module 401 having a laser diode bar 432 achieves a high-power output, the amount of heat generated in the semiconductor laser module 401 is also very large. If the submount 20 does not exhibit sufficient heat dissipation performance, the laser diode bar 432 deflects in operation due to a difference between the thermal expansion coefficient of the submount 20 and the thermal expansion coefficient of the laser diode bar 432, resulting in varied heights of emission points from the plurality of semiconductor laser devices 430. When the semiconductor laser module 401 is applied to a laser processing apparatus, light emitted from the semiconductor laser device 430 is focused by optics such as a lens. If the height of the emission points varies, it becomes very difficult to adjust an optical system for focusing the light. According to the configuration shown in FIG. 10, the electric resistance of the entire semiconductor laser module 401 can be reduced by the electrically conductive portion (the upper solder layer 60). Simultaneously, the submount 20 can be formed of a copper-diamond composite material having a thermal expansion coefficient that exhibits almost no difference from the thermal expansion coefficient of gallium arsenide (GaAs), which forms the semiconductor laser device 430. Therefore, deformation due to thermal expansion can be reduced, and variations in position of the emission points from a plurality of semiconductor laser devices 430 can be minimized.

EXAMPLE 1

In Example 1, a semiconductor laser module having a structure illustrated in FIG. 2 was prepared. A heat sink made of copper was used as the heat sink 10, and a submount made of a copper-diamond composite material was used as the submount 20. A semiconductor laser diode made of gallium arsenide (GaAs) was used as the semiconductor laser device 30. Au-Sn solder was used for the lower solder layer 50 and the upper solder layer 60.

Figure 11:
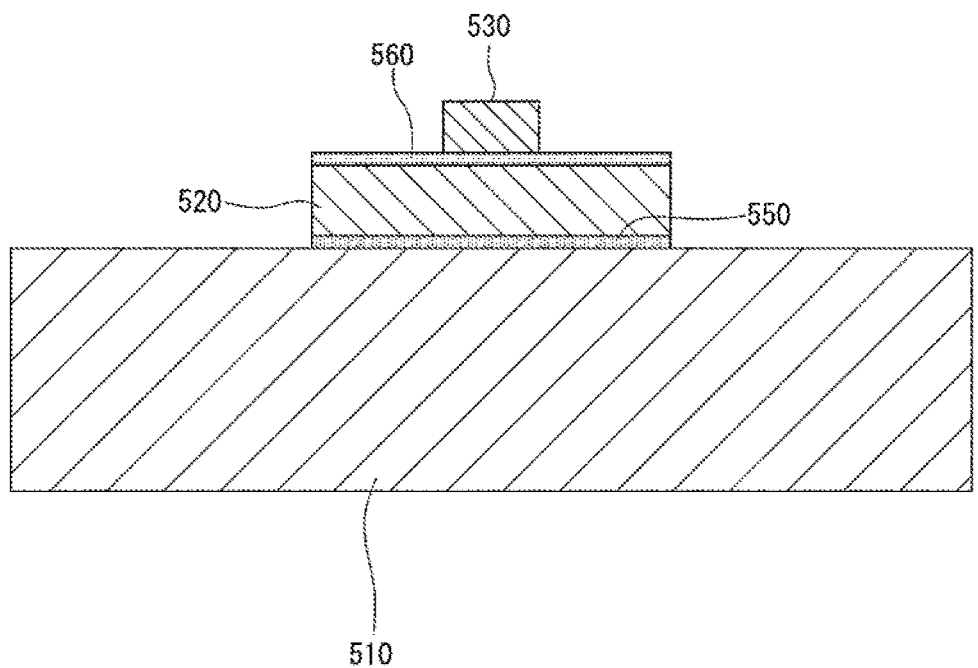
FIG. 11 is a cross-sectional view schematically showing a semiconductor laser module according to Comparative Example 1 and Comparative Example 2.

In Comparative Example 1 and Comparative Example 2, a semiconductor laser module having a structure illustrated in FIG. 11 was prepared. In each of Comparative Examples, a heat sink made of copper is used as the heat sink 510, and a semiconductor laser diode made of gallium arsenide (GaAs) was used as the semiconductor laser device 530, as with Example 1. Furthermore, Au-Sn solder was used for the solder layer 550 for fixing the submount 520 to the heat sink 510 and the solder layer 560 for fixing the semiconductor laser device 530 to the submount 520. In Comparative Example 1, a submount made of CuW was used as the submount 520. In Comparative Example 2, a submount made of a copper-diamond composite material was used as the submount 520 as with Example 1. In Comparative Example 1 and Comparative Example 2, no upper solder layer 60 extending to the heat sink 10 as illustrated in FIG. 2 was provided, and an electric current was supplied from the heat sink 510 through the submount 520 to the semiconductor laser device 530.

Figure 12:
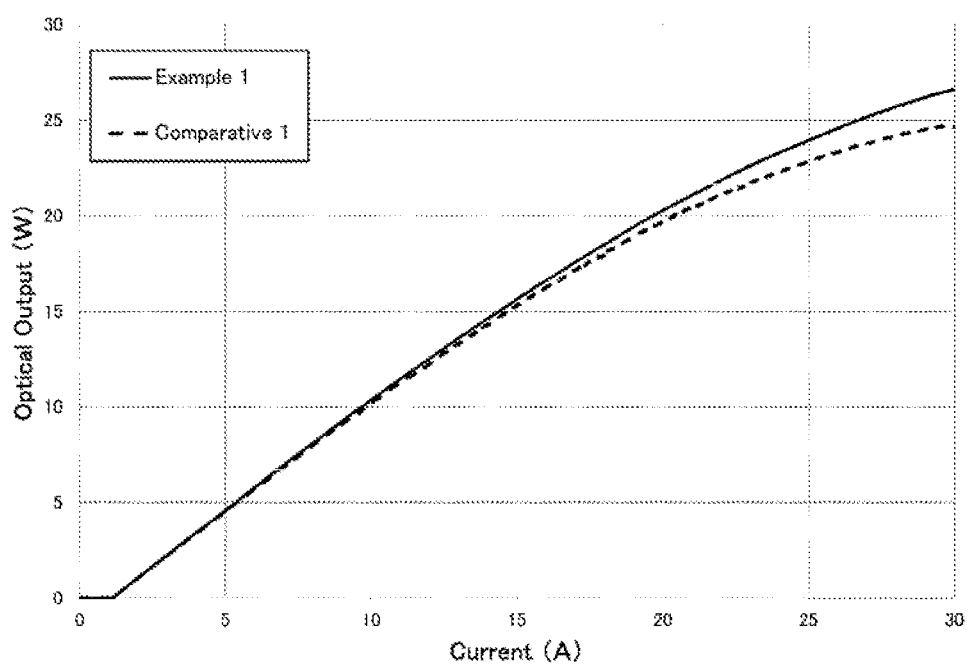
FIG. 12 is a graph showing the relationship between an electric current flowing through the semiconductor laser device and an optical output of the semiconductor laser device in Example 1 and Comparative Example 1.
Figure 13:
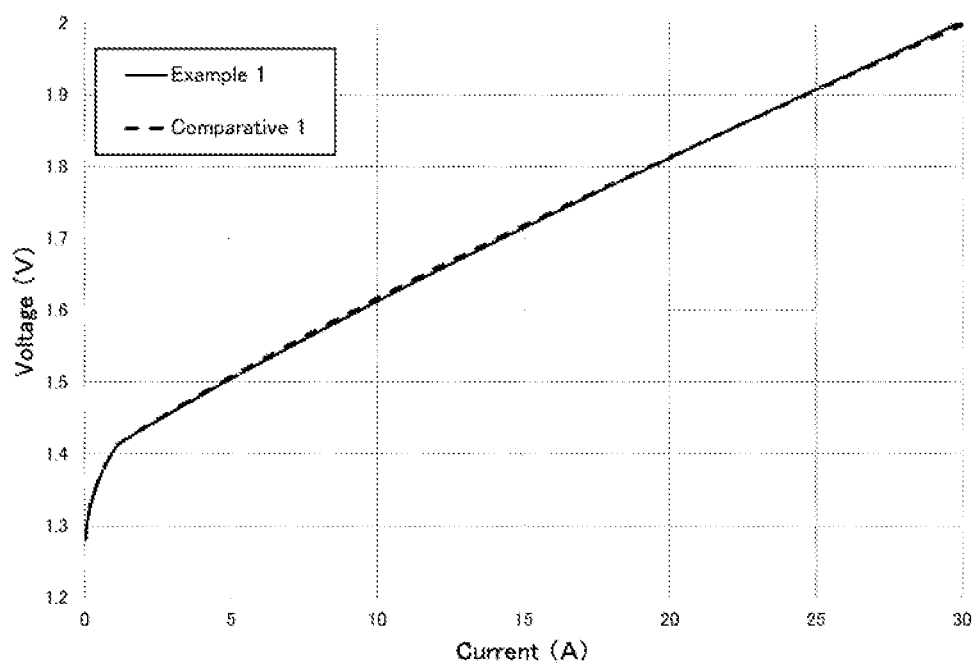
FIG. 13 is a graph showing the relationship between an electric current flowing through the semiconductor laser device and an operating voltage of the semiconductor laser device in Example 1 and Comparative Example 1.
Figure 14:
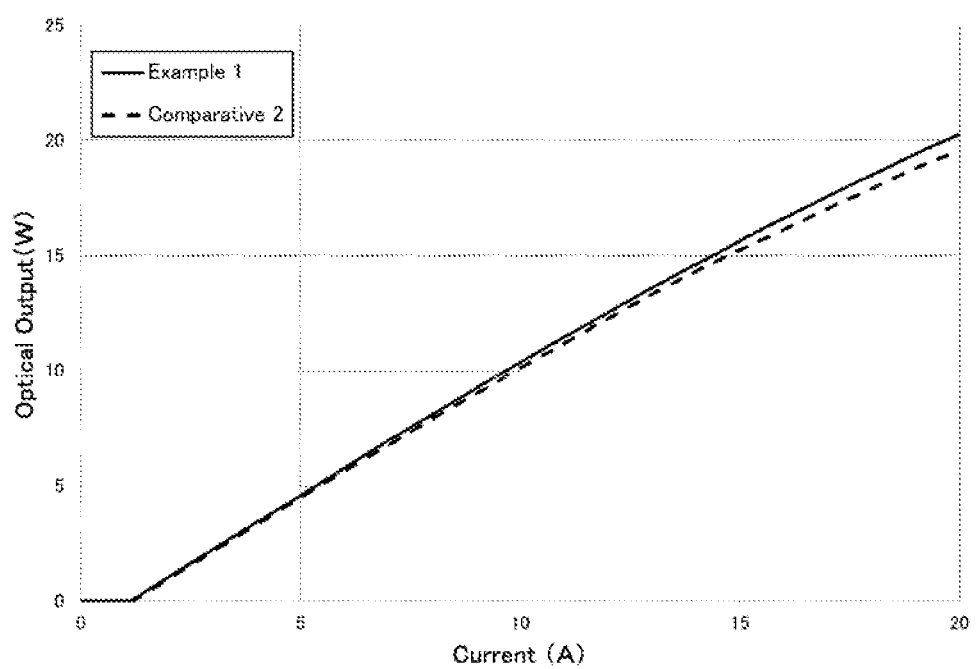
FIG. 14 is a graph showing the relationship between an electric current flowing through the semiconductor laser device and an optical output of the semiconductor laser device in Example 1 and Comparative Example 2.
Figure 15:
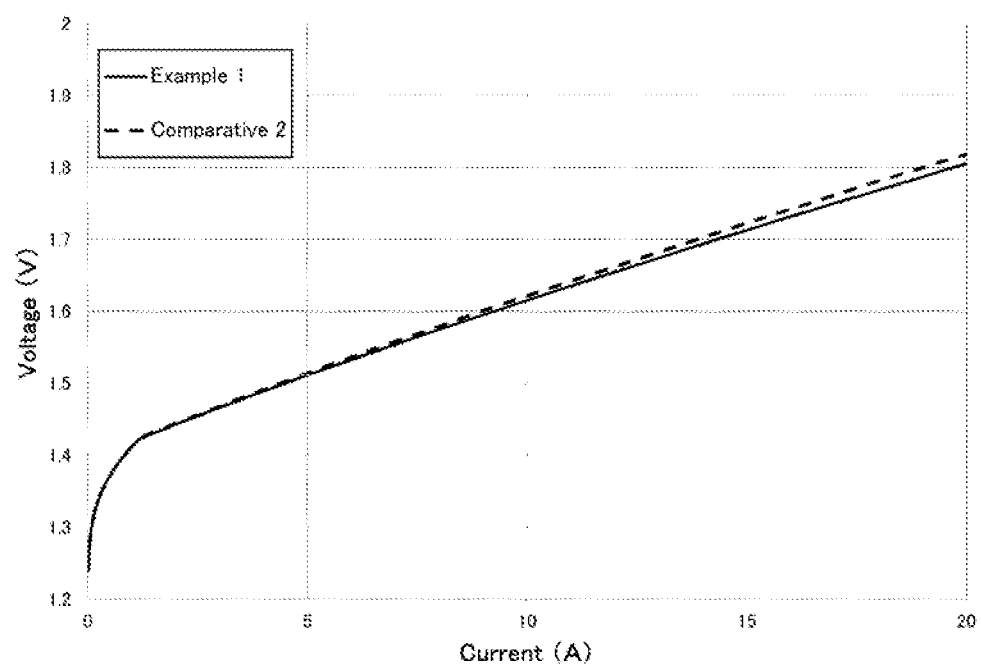
FIG. 15 is a graph showing the relationship between an electric current flowing through the semiconductor laser device and an operating voltage of the semiconductor laser device in Example 1 and Comparative Example 2.

While the semiconductor laser modules of Example 1, Comparative Example 1, and Comparative Example 2 were operated, an optical output and an operating voltage of each of the semiconductor laser devices were measured along with an electric current flowing through the semiconductor laser device. FIG. 12 is a graph showing the relationship between the electric current flowing through the semiconductor laser device and the optical output of the semiconductor laser device in Example 1 and Comparative Example 1, and FIG. 13 is a graph showing the relationship between the electric current flowing through the semiconductor laser device and the operating voltage of the semiconductor laser device in Example 1 and Comparative Example 1. FIG. 14 is a graph showing the relationship between the electric current flowing through the semiconductor laser device and the optical output of the semiconductor laser device in Example 1 and Comparative Example 2, and FIG. 15 is a graph showing the relationship between the electric current flowing through the semiconductor laser device and the operating voltage of the semiconductor laser device in Example 1 and Comparative Example 2.

As shown in FIG. 12, when the same electric current was supplied in a range in which an electric current of over 15 A flowed through the semiconductor laser device, the optical output of the semiconductor laser module in Comparative Example 1 was lowered as compared to the optical output of the semiconductor laser module in Example 1. This is possibly because, in Comparative Example 1, an electric current flowed through the submount 520 made of CuW, which has an electric resistivity higher than the upper solder layer 60 of Example 1, to cause the submount 520 to generate heat, resulting in an increased temperature of the semiconductor laser device. For the semiconductor laser module in Example 1, the optical output did not decrease even with an electric current of over 15 A. This indicates that the semiconductor laser module in Example 1 exhibited improved heat dissipation performance as compared to the semiconductor laser module of Comparative Example 1.

The copper-diamond composite material used as the submount of the semiconductor laser module in Example 1 has an electric resistivity of $10^{-4}$ Ωm, which is higher than the electric resistivity of CuW used as the submount of the semiconductor laser module in Comparative Example 1. Nevertheless, as shown in FIG. 13, the operating voltage of the semiconductor laser module in Example 1 was substantially the same as the operating voltage of the semiconductor laser module in Comparative Example 1. In other words, even though the semiconductor laser module in Example 1 employed a copper-diamond composite material as the submount, the electric resistance of the entire module could be maintained on a level with that in Comparative Example 1. This indicates that an electric current was efficiently supplied to the semiconductor laser device 30 through the electrically conductive portion of the upper solder layer 60.

Furthermore, in Comparative Example 2, a copper-diamond composite material was used for the submount as with Example 1. Nevertheless, as shown in FIG. 14, when the same electric current was supplied, the optical output of the semiconductor laser module in Comparative Example 2 was lowered as compared to the optical output of the semiconductor laser module in Example 1. This is possibly because, in Comparative Example 2, an electric current flowed through the submount 520 made of a copper-diamond composite mateiral, which has an electric resistivity higher than the upper solder layer 60 of Example 1, to cause the submount 520 to generate heat, resulting in an increased temperature of the semiconductor laser device. Moreover, as shown in FIG. 15, the operating voltage of the semiconductor laser module of Example 1 was lower than the optical output of the semiconductor laser module of Comparative Example 2. Thus, the electric resistance of the entire module could be reduced in Example 1. This indicates that an electric current was efficiently supplied to the semiconductor laser device 30 through the electrically conductive portion including the upper solder layer 60.

As described above, it can be seen that the semiconductor laser module of Example 1 can achieve both of reduction in electric resistance and improvement of the heat dissipation performance and can thus maintain efficient output characteristics.

Although some preferred embodiments of the present invention have been described, the present invention is not limited to the aforementioned embodiments. It should be understood that various different forms may be applied to the present invention within the technical idea thereof.

INDUSTRIAL APPLICABILITY

The present invention can suitably be used for a semiconductor laser module having a submount.

DESCRIPTION OF REFERENCE NUMERALS AND SIGNS

1 Semiconductor laser module
10 Heat sink
20 Submount
23 Edge portion
30 Semiconductor laser device
40 Bonding wire
50 Lower solder layer
60 Upper solder layer
101 Semiconductor laser module
201 Semiconductor laser module
220 Submount
221 Plating layer
260 Upper solder layer
301 Semiconductor laser module
320 Submount
360 Upper solder layer
370 Auxiliary conductive layer
401 Semiconductor laser module
430 Semiconductor laser device
432 Laser diode bar

The invention claimed is:
1. A semiconductor laser module comprising:
an electrically conductive heat sink;
a submount disposed above the heat sink;
a semiconductor laser device disposed above the submount; and
an electrically conductive portion electrically connected to the semiconductor laser device and the heat sink, the electrically conductive portion extending along a surface of the submount to the heat sink and having an electric resistivity lower than an electric resistivity of the submount,
wherein the electrically conductive portion includes:
an upper solder layer electrically connected to the semiconductor laser device,
a lower solder layer formed between the submount and the heat sink, and
a plating layer formed on at least a side surface of the submount and not formed on a bottom surface of the submount, the plating layer electrically connecting the upper solder layer and the lower solder layer to each other,
wherein the upper solder layer is held in direct contact with the submount.

2. The semiconductor laser module as recited in claim 1, wherein the submount has a heat conductivity higher than a heat conductivity of the electrically conductive portion.

3. The semiconductor laser module as recited in claim 1, wherein the plating layer is formed only on the side surface of the submount.

4. A method of manufacturing a semiconductor laser module having an electrically conductive heat sink, a submount disposed above the heat sink, and a semiconductor laser device disposed above the submount, the method comprising:
   forming an electrically conductive portion having an electric resistivity lower than an electric resistivity of the submount so as to extend from the semiconductor laser device to the heat sink along a surface of the submount for electrically connecting the semiconductor laser device and the heat sink to each other,
   wherein the forming of the electrically conductive portion comprises:
      forming a lower solder layer between the heat sink and the submount,
      forming a plating layer on at least a side surface of the submount and not on a bottom surface of the submount,
      disposing the submount on the lower solder layer so that the plating layer is electrically connected to the lower solder layer, and
      forming an upper solder layer electrically connected to the plating layer and the semiconductor laser device,
   wherein the forming of the upper solder layer comprises forming the upper solder layer in direct contact with the submount.

5. The method of manufacturing a semiconductor laser module as recited in claim 4, wherein the submount has a heat conductivity higher than a heat conductivity of the electrically conductive portion.

6. The method of manufacturing a semiconductor laser module as recited in claim 4, wherein the forming of the plating layer comprises forming the plating layer only on the side surface of the submount.

7. A semiconductor laser module comprising:
   an electrically conductive heat sink;
   a submount disposed above the heat sink;
   a semiconductor laser device disposed above the submount; and
   an electrically conductive portion electrically connected to the semiconductor laser device and the heat sink, the electrically conductive portion extending along a surface of the submount to the heat sink and having an electric resistivity lower than an electric resistivity of the submount,
   wherein the electrically conductive portion includes:
      an upper solder layer electrically connected to the semiconductor laser device,
      a lower solder layer formed between the submount and the heat sink, and
   a plating layer is formed only on a side surface of the submount, the plating layer electrically connecting the upper solder layer and the lower solder layer to each other.

8. The semiconductor laser module as recited in claim 7, wherein the submount has a heat conductivity higher than a heat conductivity of the electrically conductive portion.

9. A method of manufacturing a semiconductor laser module having an electrically conductive heat sink, a submount disposed above the heat sink, and a semiconductor laser device disposed above the submount, the method comprising:
   forming an electrically conductive portion having an electric resistivity lower than an electric resistivity of the submount so as to extend from the semiconductor laser device to the heat sink along a surface of the submount for electrically connecting the semiconductor laser device and the heat sink to each other,
   wherein the forming of the electrically conductive portion comprises:
      forming a lower solder layer between the heat sink and the submount,
      forming a plating layer comprises forming the plating layer only on a side surface of the submount,
      disposing the submount on the lower solder layer so that the plating layer is electrically connected to the lower solder layer, and
      forming an upper solder layer electrically connected to the plating layer and the semiconductor laser device.

10. The method of manufacturing a semiconductor laser module as recited in claim 9, wherein the submount has a heat conductivity higher than a heat conductivity of the electrically conductive portion.

* * * * *